(12) United States Patent
Zdebel et al.

(10) Patent No.: US 6,610,143 B2
(45) Date of Patent: *Aug. 26, 2003

(54) METHOD OF MANUFACTURING A SEMICONDUCTOR COMPONENT

(75) Inventors: Peter J. Zdebel, Austin, TX (US); Julio Carlos Costa, Phoenix, AZ (US)

(73) Assignee: Semiconductor Components Industries LLC, Phoenix, AZ (US)

(*) Notice: Subject to any disclaimer, the term of this patent is extended or adjusted under 35 U.S.C. 154(b) by 23 days.

This patent is subject to a terminal disclaimer.

(21) Appl. No.: 09/764,981

(22) Filed: Jan. 16, 2001

(65) Prior Publication Data

US 2002/0092463 A1 Jul. 18, 2002

(51) Int. Cl.[7] .............................................. C30B 23/00
(52) U.S. Cl. .................................................... 117/94
(58) Field of Search ............................. 117/89, 94, 95, 117/104, 935

(56) References Cited

U.S. PATENT DOCUMENTS

| | | | | |
|---|---|---|---|---|
| 5,084,409 A | * | 1/1992 | Beam, III et al. ............ | 437/80 |
| 5,252,500 A | * | 10/1993 | Sato ............................. | 437/31 |
| 5,262,335 A | * | 11/1993 | Streit et al. .................... | 437/31 |
| 5,481,120 A | * | 1/1996 | Mochizuk et al. ............. | 257/49 |
| H1637 H | * | 3/1997 | Offord et al. | |
| 5,804,487 A | * | 9/1998 | Lammert ..................... | 438/319 |
| 5,885,847 A | * | 3/1999 | Yoon et al. ................... | 438/59 |
| 6,387,768 B1 | | 5/2002 | Sakamoto | |

FOREIGN PATENT DOCUMENTS

| | | | | |
|---|---|---|---|---|
| JP | 05/29332 | * | 2/1993 | |
| WO | WO0003427 | | 1/2000 | ......... H01L/21/336 |

* cited by examiner

Primary Examiner—Robert Kunemund

(57) ABSTRACT

A method of manufacturing a semiconductor component includes forming an electrically insulative layer (220) over a semiconductor substrate where a first portion of the electrically insulative layer is located over a first region (560) of the semiconductor substrate and where a second portion of the first layer is located over a second region (550) of the semiconductor substrate. An isolation region (610) is formed in the semiconductor substrate between the first and second regions of the semiconductor substrate. After forming the isolation region, the second portion of the first layer is removed, and, after removing the second potion of the first layer, an epitaxial layer (630) is grown over the second region of the semiconductor substrate.

24 Claims, 31 Drawing Sheets

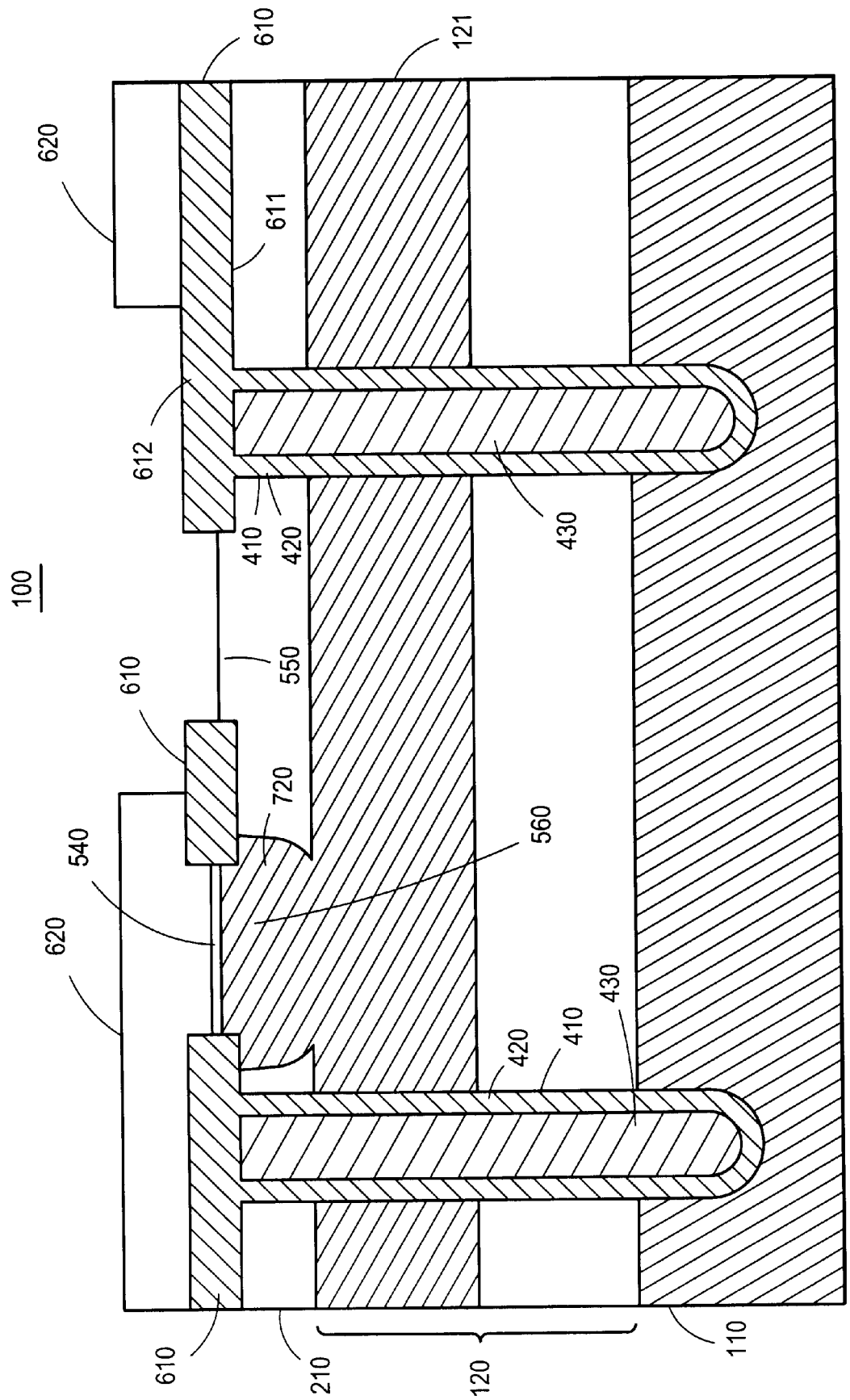

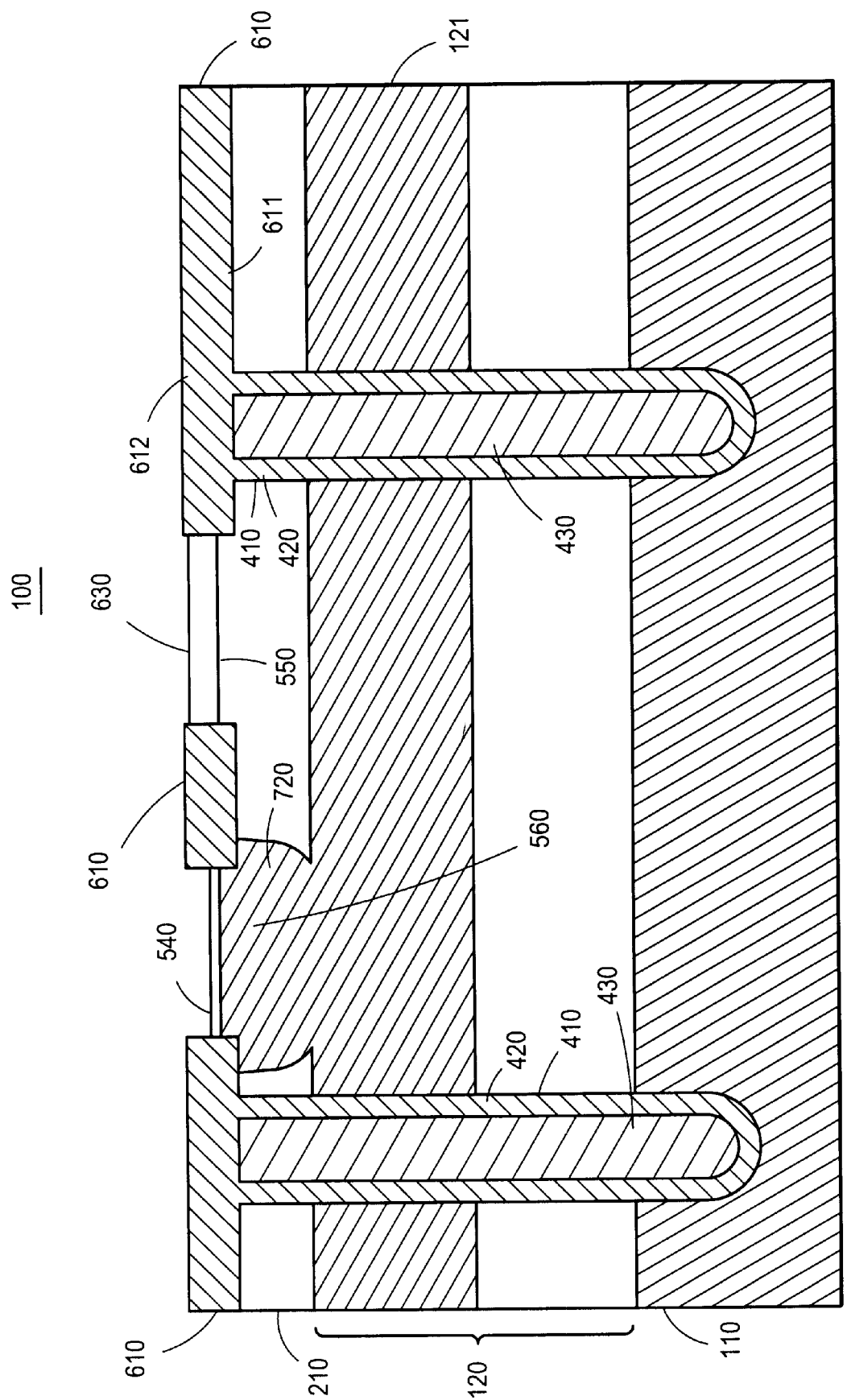

METHOD OF MANUFACTURING A SEMICONDUCTOR COMPONENT

BACKGROUND OF THE INVENTION

This invention relates, in general, to electronics, and more particularly, to methods of manufacturing semiconductor components and semiconductor components thereof.

Bipolar transistors are used in many different electronic applications, including integrated circuits and discrete components. Homojunction bipolar transistors have limited high frequency applications because their transit frequency ($f_T$) is typically well below 40 GigaHertz (GHz). Heterojunction Bipolar Transistors (HBT) have superior high frequency characteristics because their $f_T$ is greater than that for homojunction bipolar transistors. In many instances, the $f_T$ of an HBT is 100 GHz or higher.

As an example, a HBT can include a silicon substrate and a silicon germanium carbon layer contacting the silicon substrate. The interface between the silicon substrate and the silicon germanium carbon layer forms the heterojunction. However, existing methods for manufacturing HBTs do not produce HBTs exhibiting superior high frequency characteristics.

Accordingly, a need exists for a method of manufacturing a semiconductor component where the method is compatible with existing semiconductor processing techniques and where the method produces a semiconductor component that has superior high frequency performance characteristics.

BRIEF DESCRIPTION OF THE DRAWINGS

The invention will be better understood from a reading of the following detailed description, taken in conjunction with the accompanying drawing figures in which:

FIGS. 6A through 6E illustrate cross-sectional views of the semiconductor component after several subsequent steps of the manufacturing process in accordance with an embodiment of the invention;

Figure 1:
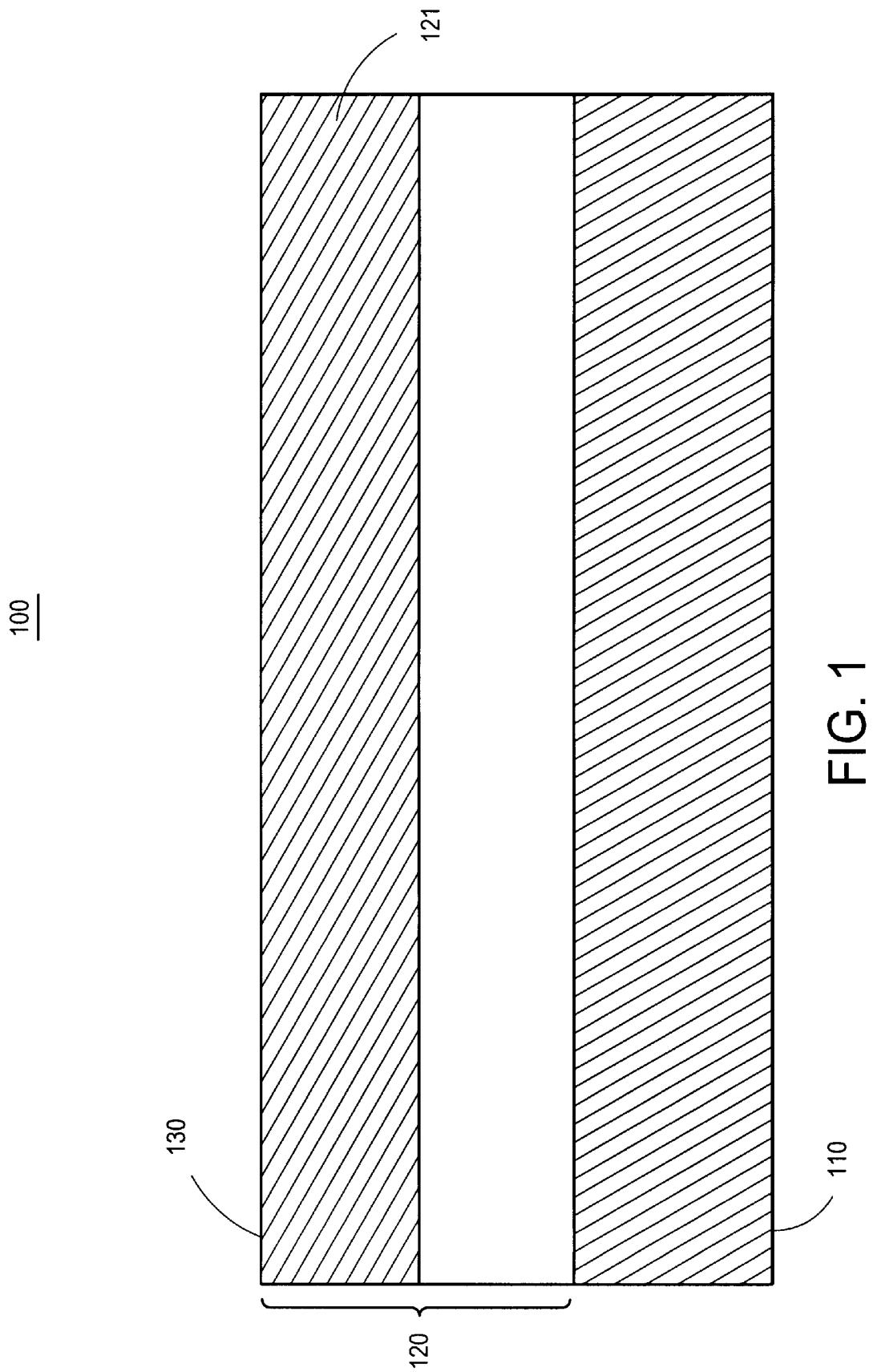
FIGS. 1 through 5 illustrate cross-sectional views of a semiconductor component after different steps of a manufacturing process in accordance with an embodiment of the invention.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

Moreover, the terms front, back, top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

FIGS. 1 through 25 illustrate cross-sectional views of a semiconductor component 100 after different steps of a manufacturing process. Semiconductor component 100 can be an integrated circuit including at least one HBT. In the preferred embodiment, however, semiconductor component 100 is a discrete HBT.

As illustrated in FIG. 1, a substrate 110 is provided. Substrate 110 is comprised of silicon. As an example, substrate 110 can have a P+ doping concentration to lower the resistivity of substrate 110 to approximately 0.09 to 0.11 ohm-centimeters (ohm-cm). Substrate 110 can include an undoped silicon epitaxial layer 120. At least a portion of epitaxial layer 120 of substrate 110 will form an emitter region for the HBT in component 100.

An implant screen layer 130 is formed over epitaxial layer 120. As an example, layer 130 can be thermally grown over layer 120. Layer 130 can be comprised of silicon dioxide.

A high implant concentration of an n-type dopant is implanted through layer 130 and into a top portion of epitaxial layer 120 to form a buried layer 121 within epitaxial layer 120. Layer 121 serves as a buried collector region for the HBT in electronic component 100. Substrate 110 is subsequently annealed to activate the implanted dopants within epitaxial layer 120.

Figure 2:
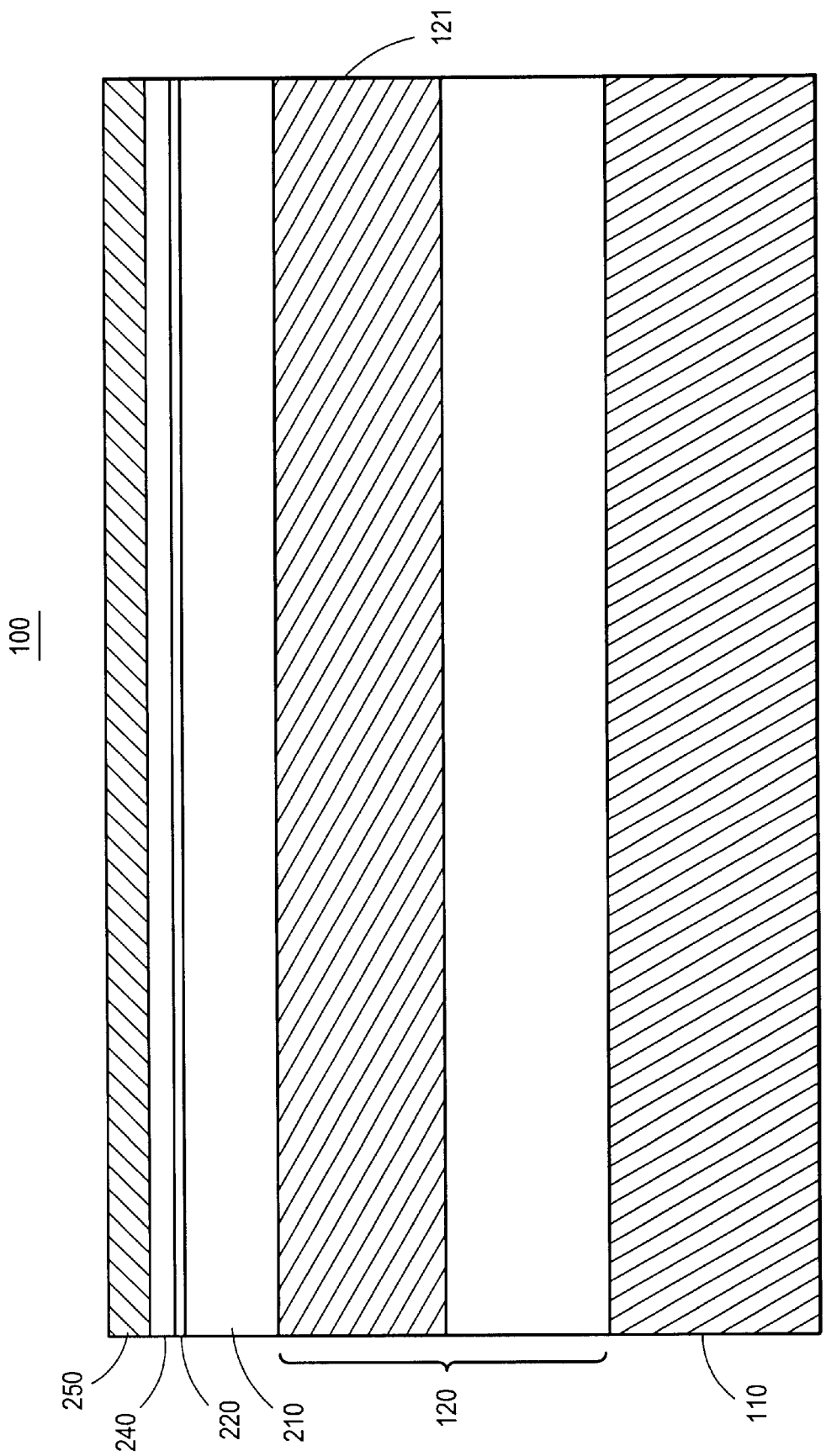

Turning to FIG. 2, implant screen layer 130 of FIG. 1 is removed prior to growing an n-type epitaxial layer 210 over epitaxial layer 120. Layer 210 has a lower doping concentration than buried layer 121 and the bottom portion of substrate 110. As an example, layer 210 can have a thickness of approximately one micrometer. Furthermore, layer 210 can have an n-type doping concentration of approximately $2 \times 10^{15}$ atoms per centimeter cubed ($cm^{-3}$), which permits a lowering of a base-to-collector capacitance in the HBT of component 100. Layer 210 can be considered part of substrate 110.

Next, three electrically insulative layers 220, 240, and 250 can be formed sequentially over epitaxial layer 210. As an example, layer 220 can be comprised of silicon dioxide and can be thermally grown over epitaxial layer 210 to a thickness of approximately 15 nanometers. In the preferred embodiment, layer 220 is formed on the top surface of layer 210. Furthermore, layer 240 can be comprised of silicon nitride and can be deposited to a thickness of approximately 150 nanometers, and layer 250 can be comprised of Tetra-Ethyl-Ortho-Silicate (TEOS) and can be deposited to a thickness of approximately 300 nanometers. Layer 250 serves as a hardmask during a subsequent trench etching process.

Figure 3:
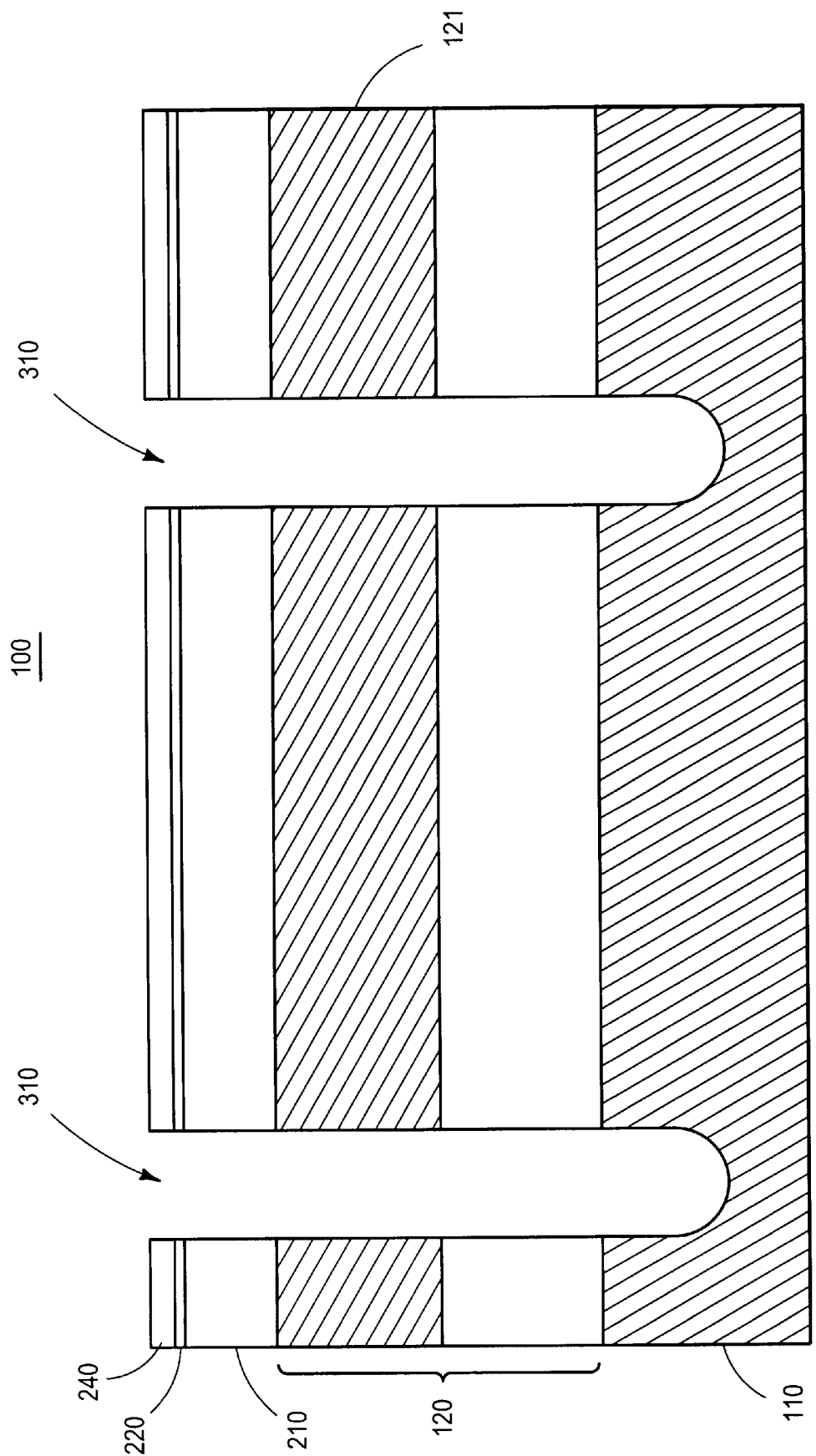

In FIG. 3, layer 250 is patterned and is subsequently used as an etch mask to etch trenches 310 sequentially into layers 240, 220, 210, and 120. Trenches 310 also preferably extend into the portion of substrate 110 located immediately below epitaxial layer 120. As an example, trenches 310 can have a depth of approximately 4.5 to 5 micrometers. In the preferred embodiment, trenches 310 are formed using a Reactive Ion Etch (RIE) process to form substantially parallel side walls for trenches 310.

Figure 4:
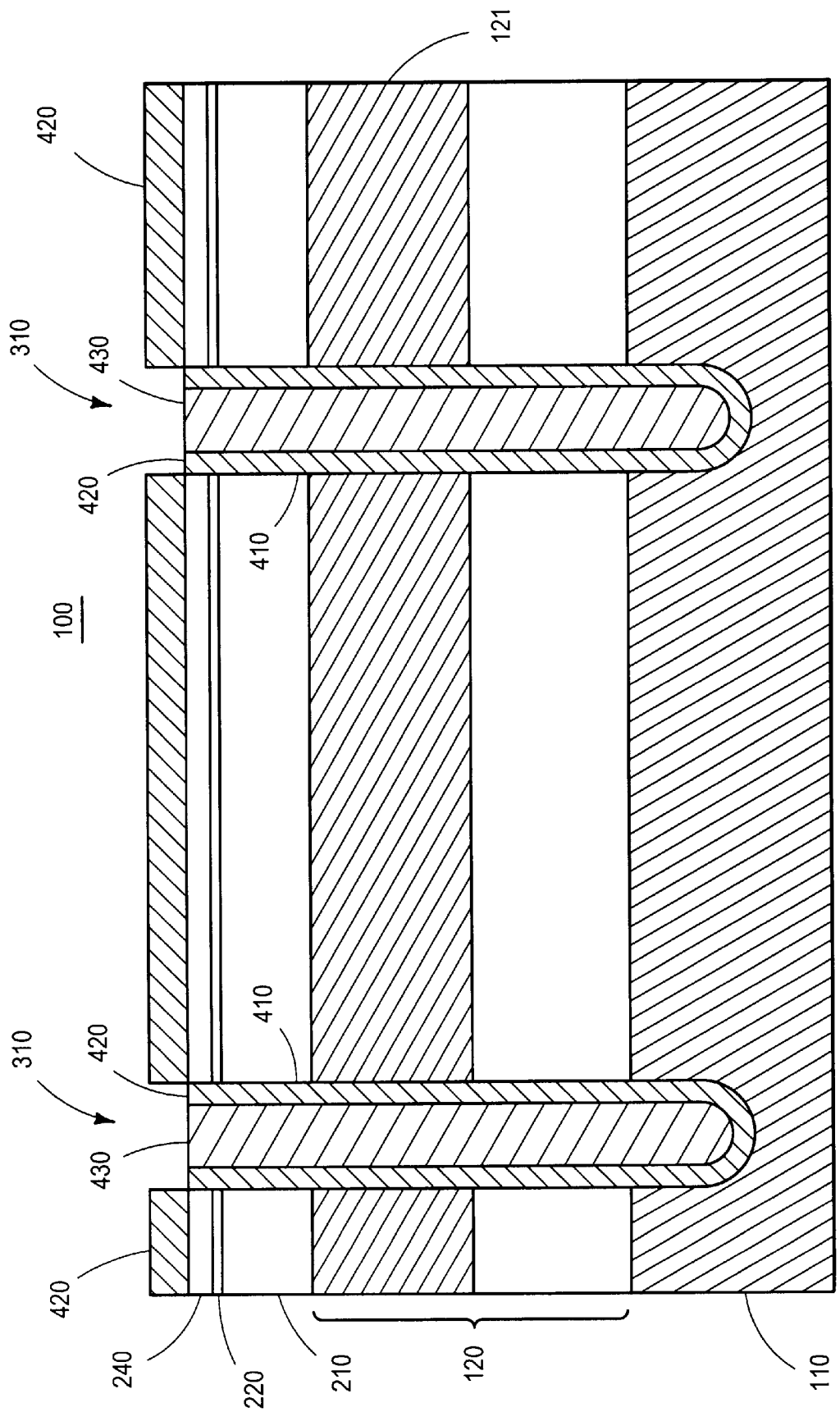

Next, as illustrated in FIG. 4, the semiconductor structure is annealed to grow a layer 410 of silicon dioxide on the side walls of trenches 310. As an example, layer 410 can have a thickness of approximately 50 nanometers. Then, an electrically insulative layer 420 is deposited in trenches 310 and over electrically insulative layer 240. As an example, layer 420 can be comprised of 300 nanometers of TEOS. Subsequently, a layer 430 of polysilicon is deposited in trenches 310 to fill trenches 310. The layer of polysilicon is etched back to planarize the structure to expose portions of layer 420, as illustrated in FIG. 4.

Figure 5:
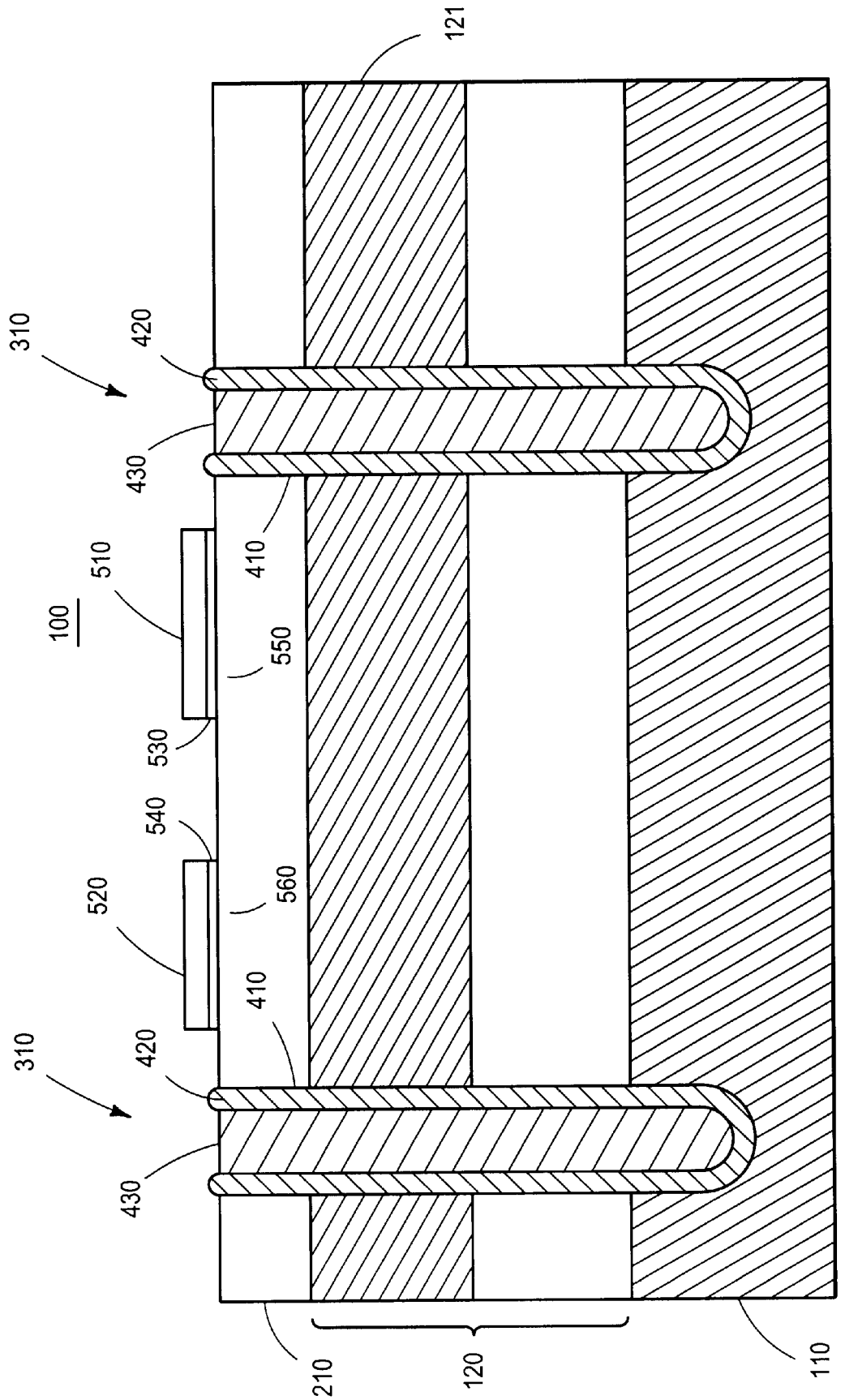

Turning to FIG. 5, portions of layer 420 located over layer 240 (FIG. 4) are removed preferably using a RIE process. Then, layer 240 (FIG. 4) is patterned into portions 510 and 520. In the preferred embodiment, layer 240 (FIG. 4) is patterned using an RIE process. Next, layer 220 (FIG. 4) is patterned into portions 530 and 540. In the preferred embodiment, layer 220 (FIG. 4) is patterned using a wet etchant. Portion 510 is located over portion 530, and portion 520 is located over portion 540. Portions 510 and 530 are each located over a region 550 of layer 210, and portions 520 and 540 are each located over a region 560 of layer 210.

Figure 6A:
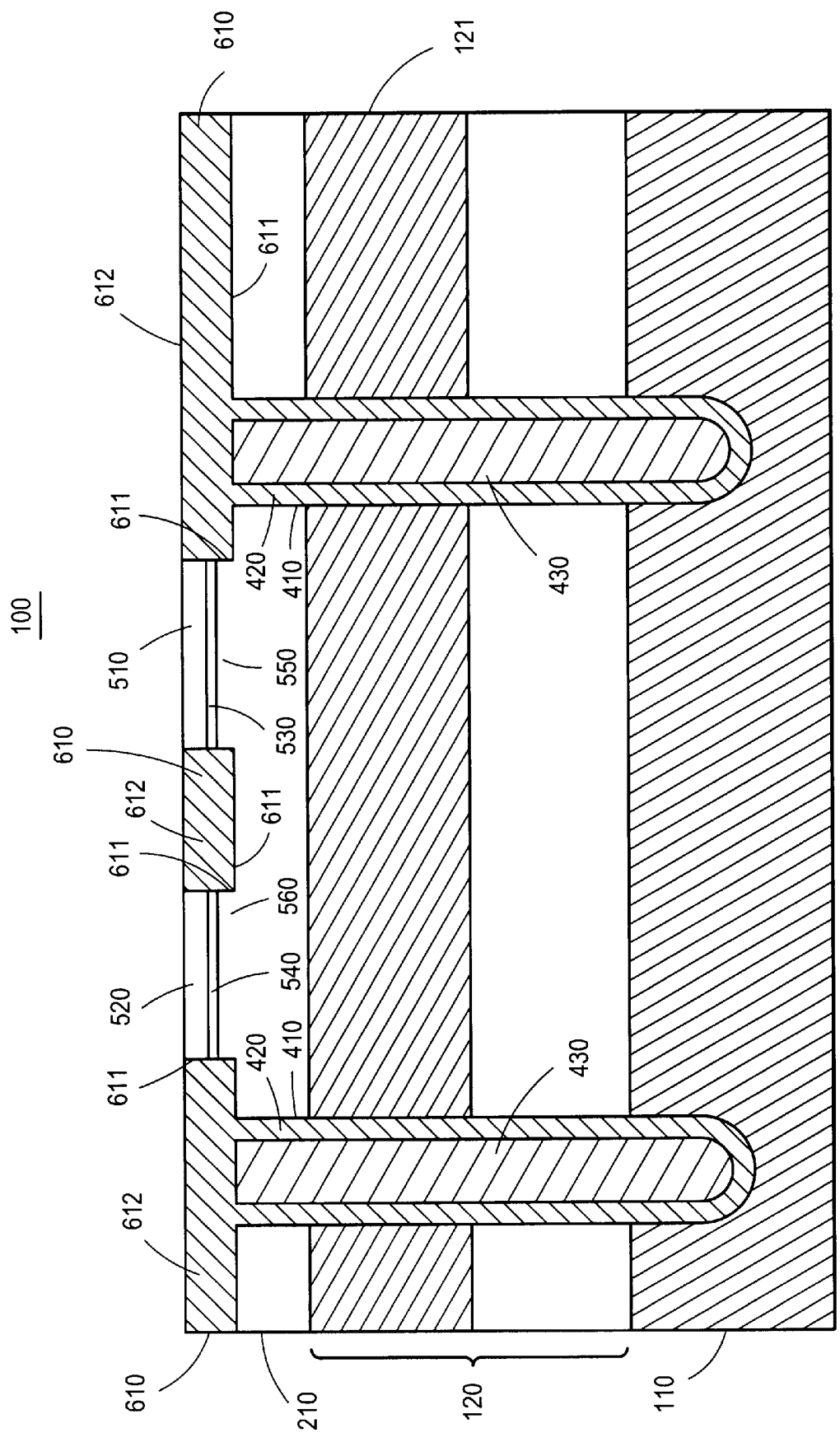

As illustrated in FIG. 6A, isolation regions 610 are formed over and in epitaxial layer 210. One of regions 610 is located between regions 550 and 560 of layer 210. As an example, regions 610 can be formed using a Shallow Trench Isolation (STI) process. In this embodiment, portions 510 and 520 are used as a hard mask or etch mask to etch trenches into epitaxial layer 210. These trenches are more shallow than trenches 310 in FIG. 3. Subsequently, a layer 611 can be thermally grown on the side walls of the shallow trenches. As an example, layer 611 can have a thickness of approximately 50 nanometers.

Then, an electrically insulative layer 612 can be deposited in the shallow trenches and over portions 510 and 520. As an example, layer 612 can be comprised of TEOS. Layer 612 is etched back to planarize the structure and to expose portions 510 and 520. As an example, a Chemical-Mechanical Polishing (CMP) process can be used to planarize layer 612. The end point for the CMP process is the chemical, optical, or other detection of the composition of portions 510 and 520. Therefore, in the preferred embodiment, the top surfaces of regions 610 and portions 510 and 520 form a substantially planar surface located above the top surfaces of layer 210 and portions 530 and 540. This planarity facilitates the manufacturing of subsequent structures in component 100.

In a different embodiment, regions 610 can be formed by using portions 510 and 520 (FIG. 5) of electrically insulative layer 240 (FIG. 4) in a Polysilicon Encapsulated Local OXidation (PELOX) process. In this embodiment, however, regions 610 will have a different configuration than that illustrated in FIG. 6A and will require more space across layer 210.

Figure 6B:
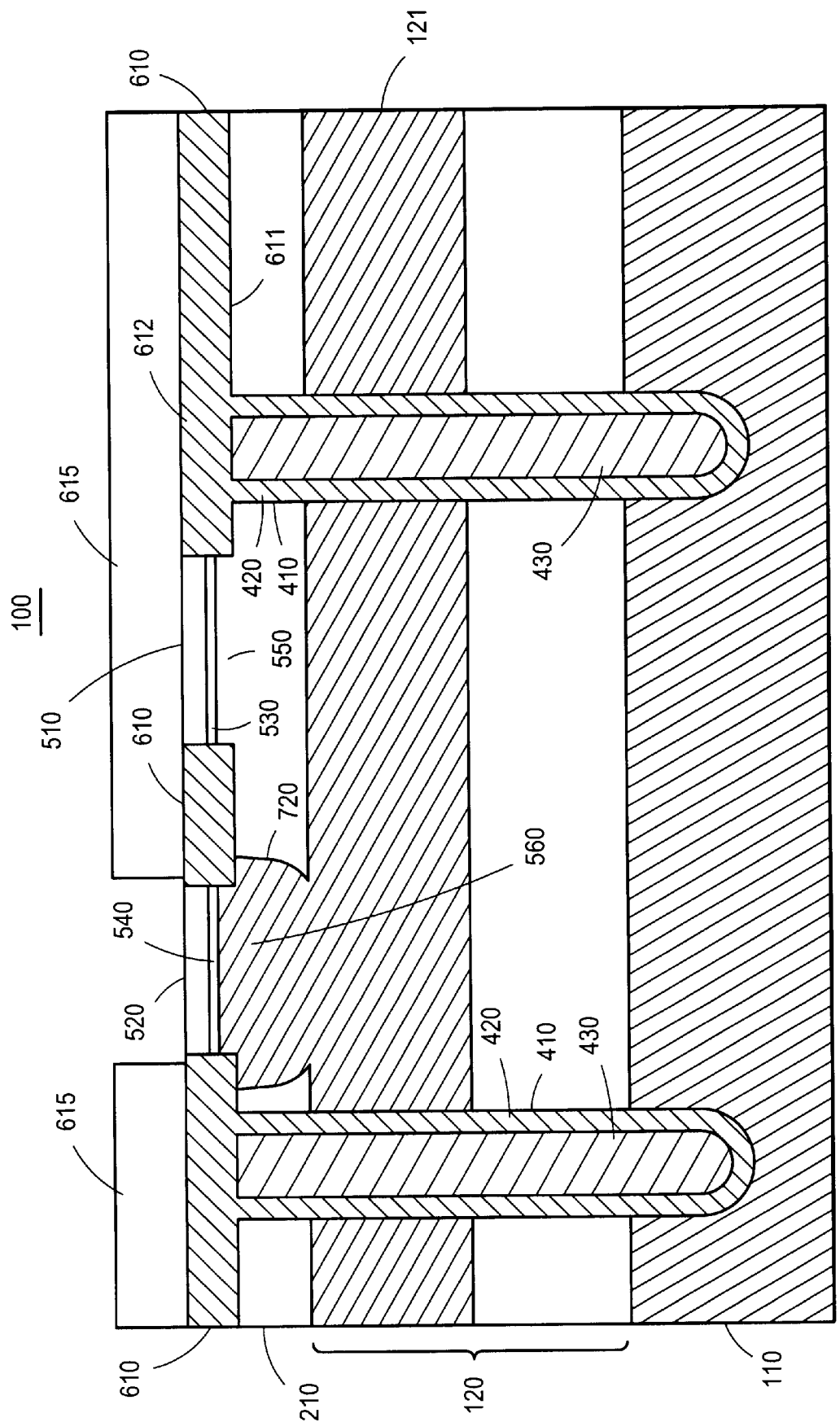

In FIG. 6B, a collector region 720 can be formed in layer 210. As an example, layers 520 and 540 serve as an implant screen during an ion implantation process used to form collector region 720 in layer 210. The ion implantation process can be comprised of a single implant or multiple implants at different implantation energies and ion doses. The ion implantation process is preferably a self-aligned process, and an ion implant mask 615 is used during the process to prevent the simultaneous implantation of ions; through portions 510 and 530. As an example, implant mask 615 can be comprised of photoresist. After removing implant mask 615, region 720 can be annealed. Region 720 has an N+ conductivity type and contacts layer 121. In the preferred embodiment, region 720 has the same doping concentration as layer 121.

Figure 6C:
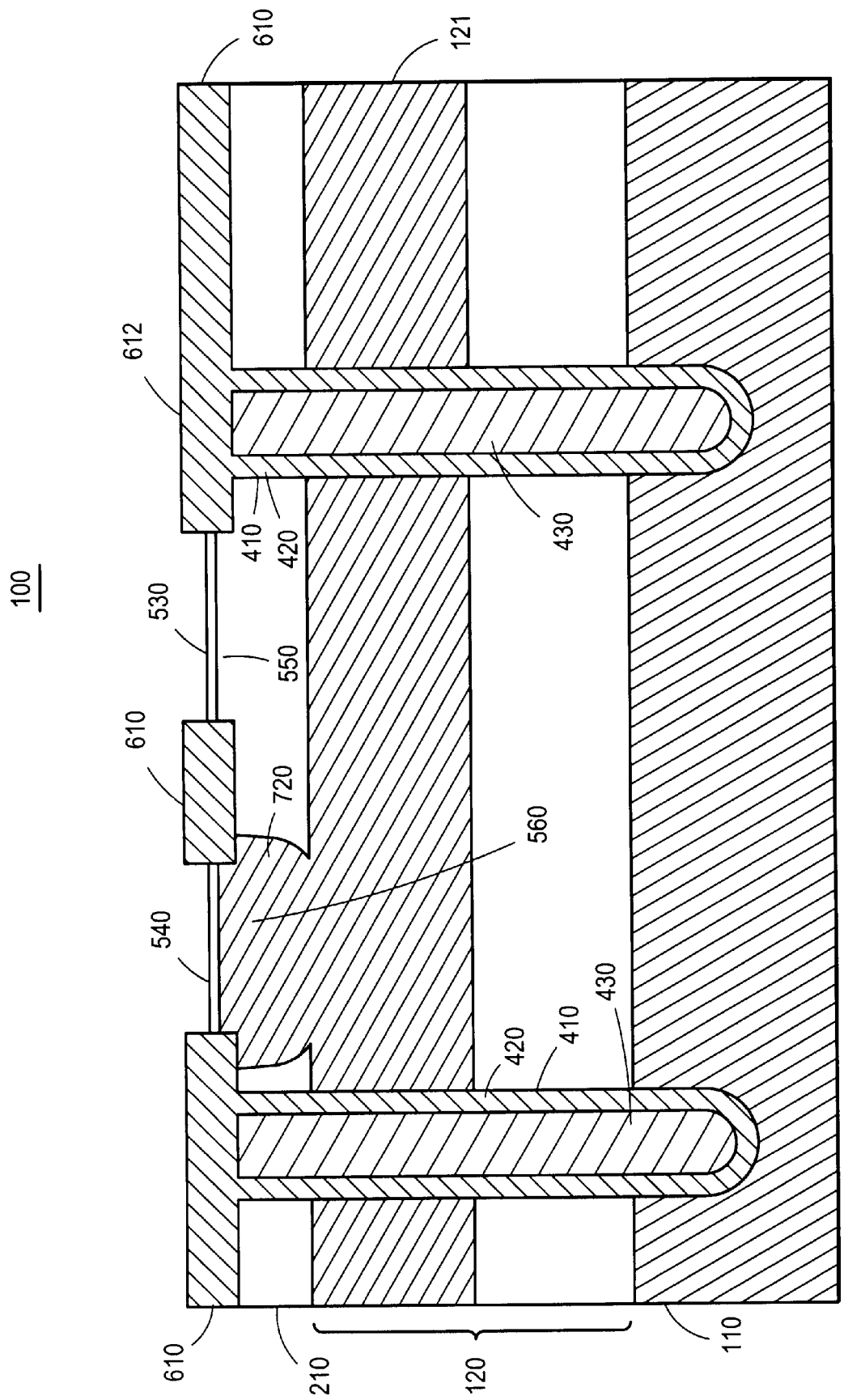

Turning to FIG. 6C, portions 510 and 520 (FIG. 6B) are etched away to expose portions 540 and 530. In a different embodiment of the manufacturing process, collector region 720 can be implanted after the removal of portions 510 and 520 (FIG. 6B), instead of before the removal of portions 510 and 520 (FIG. 6B).

Next, in FIG. 6D, portion 530 (FIG. 6C) is etched away to expose region 550 of layer 210. As an example, a wet etchant comprised of hydrofluoric acid can be used to remove portion 530. Portion 540 is protected from the etchant by an etch mask 620. As an example, etch mask 620 can be comprised of photoresist. Mask 620 is removed after the etch process.

Then, in FIG. 6E, a layer 630 is formed over region 550 of epitaxial layer 210. As an example, layer 630 can be comprised of silicon, silicon germanium, or silicon germanium carbon. In the preferred embodiment, layer 630 is epitaxially grown on region 550 of epitaxial layer 210. Therefore, layer 630 preferably physically contacts epitaxial layer 210. At least a portion of layer 630 forms a base region for the HBT. When layers 630 and 210 are comprised of at least one different material, a heterojunction exists at the interface between layer 630 and epitaxial layer 210. The epitaxial grown process used to form layer 630 is preferably a selective growth process such that layer 630 is not substantially formed over, for example, regions 610. Layer 630 can have a thickness of approximately fifty to two hundred nanometers.

The top surfaces of layer 630 and regions 610 preferably form a substantially planar surface. Accordingly, the thickness of portion 510 (FIG. 6B) preferably determines the thickness of layer 630. The planarity of the top surfaces of layer 630 and regions 610 facilitates the manufacturing of subsequent structures in component 100. In a different embodiment, the top surface of layer 630 can be located above or below the top surface of region 610.

Figure 7:
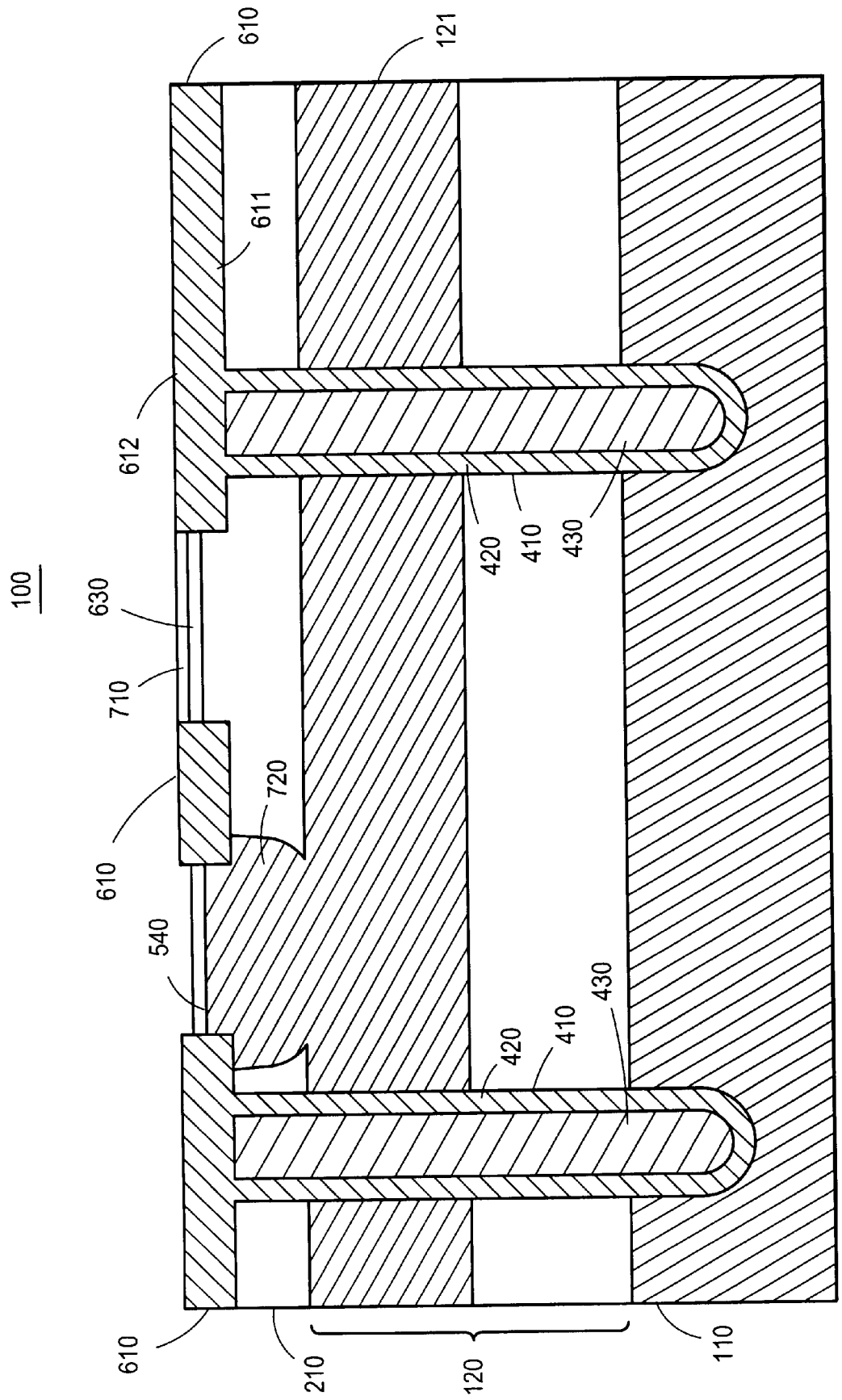
FIGS. 7 through 25 illustrate cross-sectional views of the semiconductor component after additional subsequent steps of the manufacturing process in accordance with an embodiment of the invention.

In FIG. 7, a layer 710 is formed over layer 630. As an example, layer 710 can be comprised of silicon dioxide and can be thermally grown on layer 630 to have a thickness of approximately 20–50 nanometers. This thermal growth process selectively forms layers 710 and will also increase the thickness of portion 540. In a different embodiment, layer 710 can be formed by depositing a layer over layer 630 and regions 610 and, then, patterning the layer.

Figure 8:
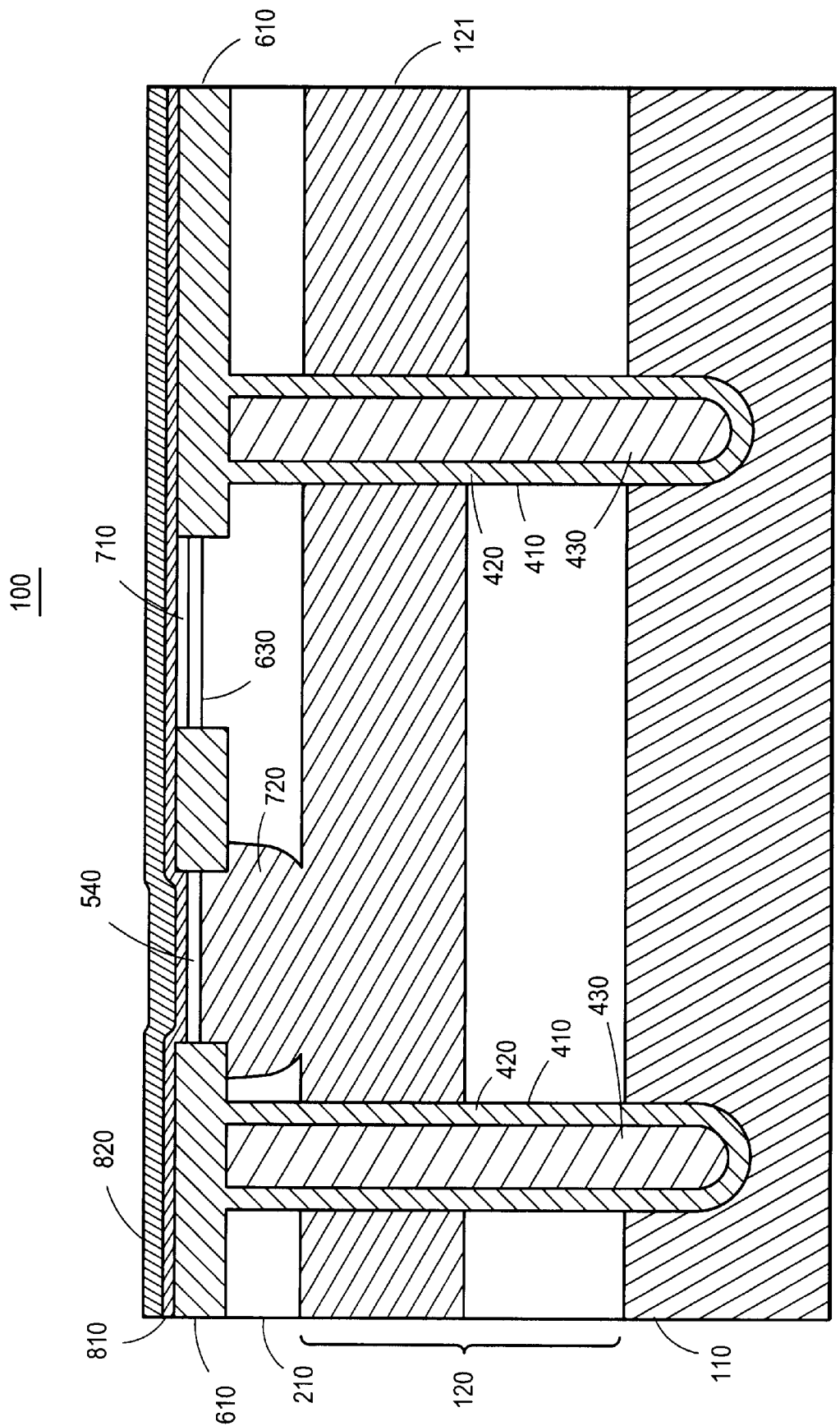
Figure 9:
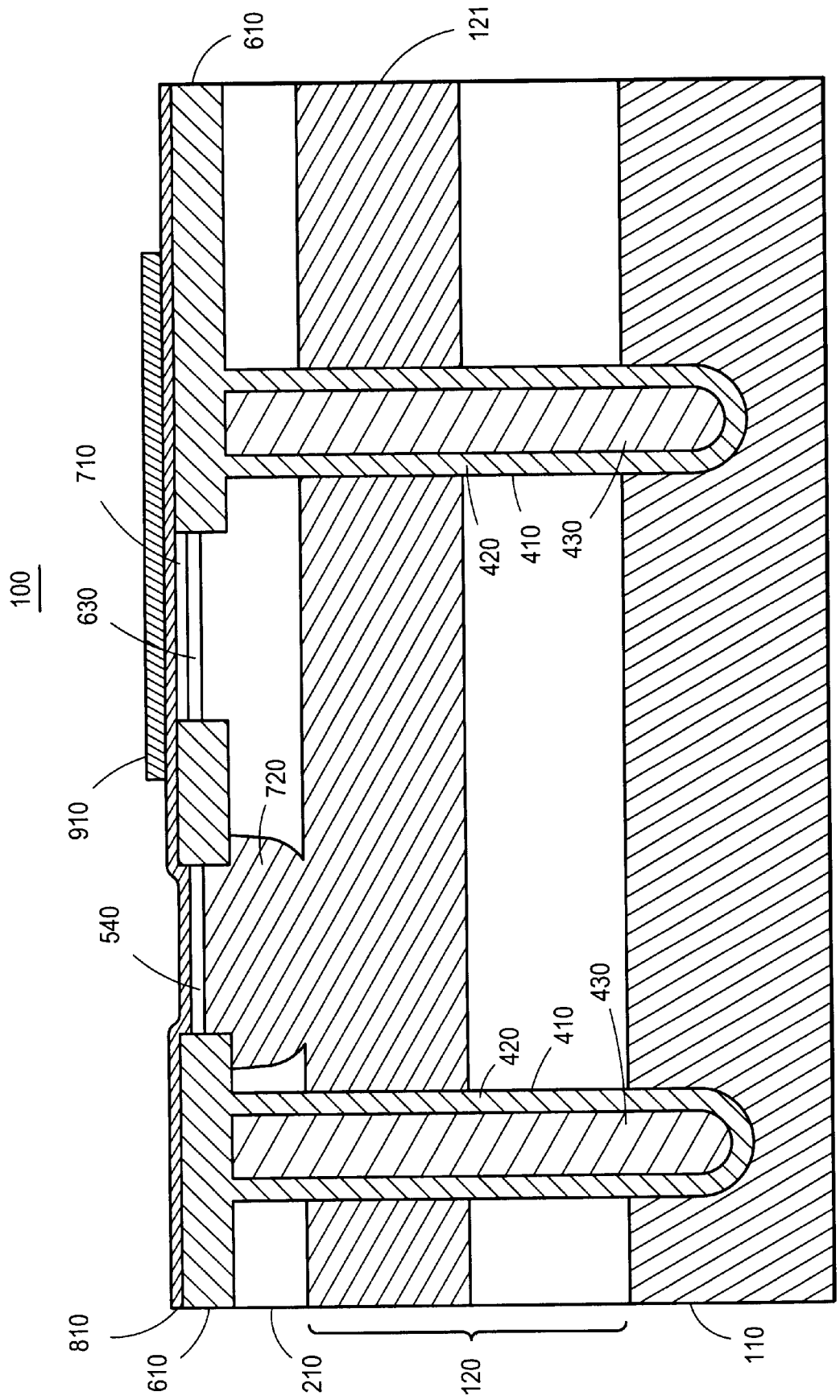

Turning to FIG. 8, layers 810 and 820 are formed sequentially over regions 610, layer 710, and substrate 110. In the preferred embodiment, layer 810 is an electrically insulative layer, and layer 820 is an electrically conductive layer. As an example, layer 810 can be comprised of silicon nitride and can have a thickness of approximately 100 nanometers. Also as an example, layer 820 can be comprised of polysilicon and can have a thickness of approximately 180 nanometers. Layer 820 is located over layer 810 and is preferably located on or contacts layer 810. A portion of layer 820 is doped with a P-type dopant and will serve as an extrinsic lead to a base region for the HBT. As illustrated in FIG. 9, layer 820 (FIG. 8) is patterned to leave a portion 910. Portion 910 is at least a portion of the doped portion of layer 820.

Figure 10:
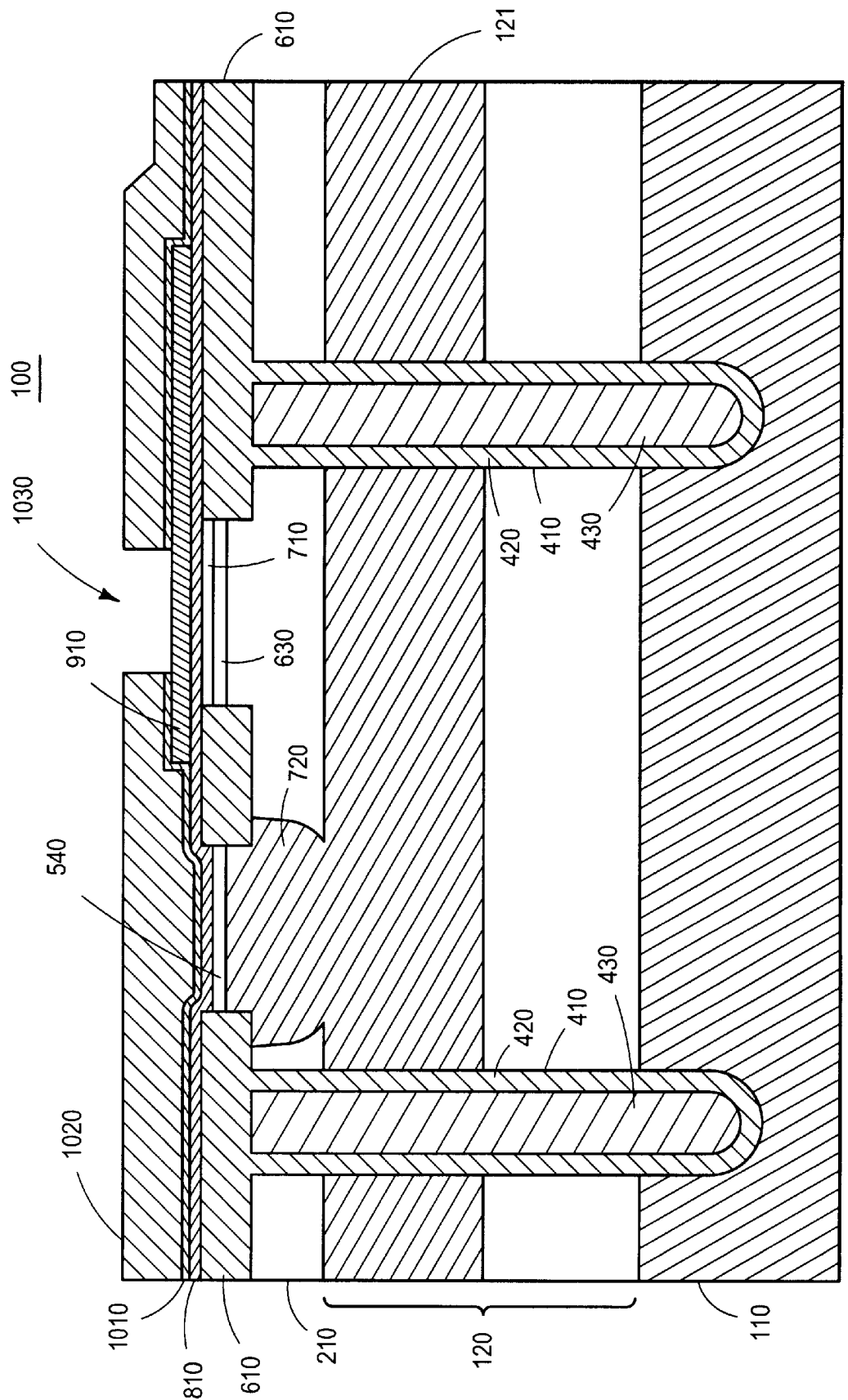

As illustrated in FIG. 10, electrically insulative layers 1010 and 1020 are deposited sequentially over portion 910, layer 810, regions 610, layer 710, and substrate 110. In the preferred embodiment, layer 1010 is comprised of silicon nitride and has a thickness of approximately 50 nanometers.

Also in the preferred embodiment, layer 1020 is comprised of TEOS and has a thickness of approximately 1,000 nanometers. Layer 1020 can be planarized, if desired, and then, layer 1020 is patterned to defined a hole 1030 within layer 1020. Hole 1030 is also formed or extended into layer 1010. The etching of hole 1030 defines an opening for the subsequent formation of both a base region and an emitter region for the HBT. In the preferred embodiment, hole 1030 has side walls that are substantially parallel to each other. In the preferred embodiment, hole 1030 exposes a portion of portion 910 of the electrically conductive layer.

Figure 11:
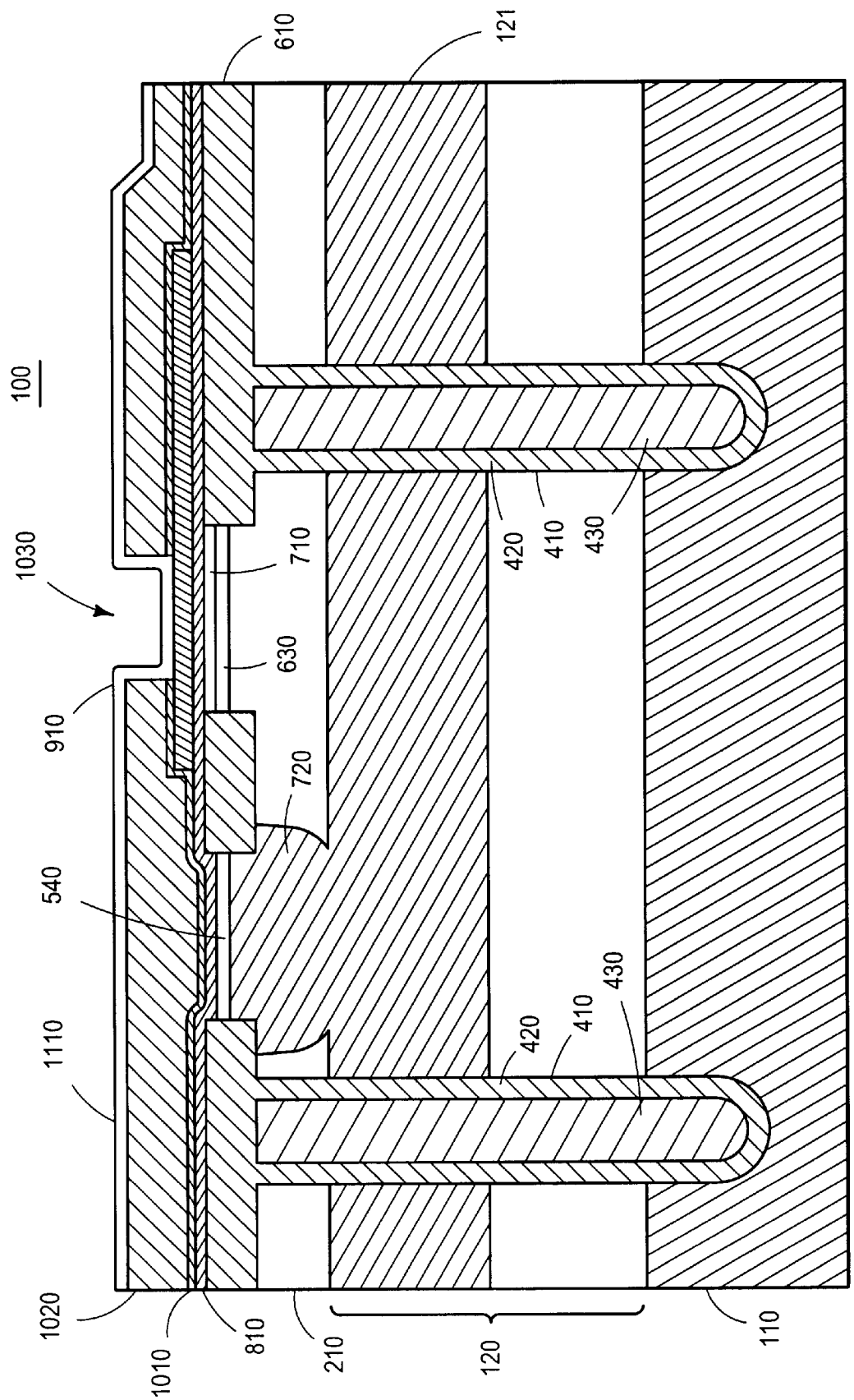
Figure 12:
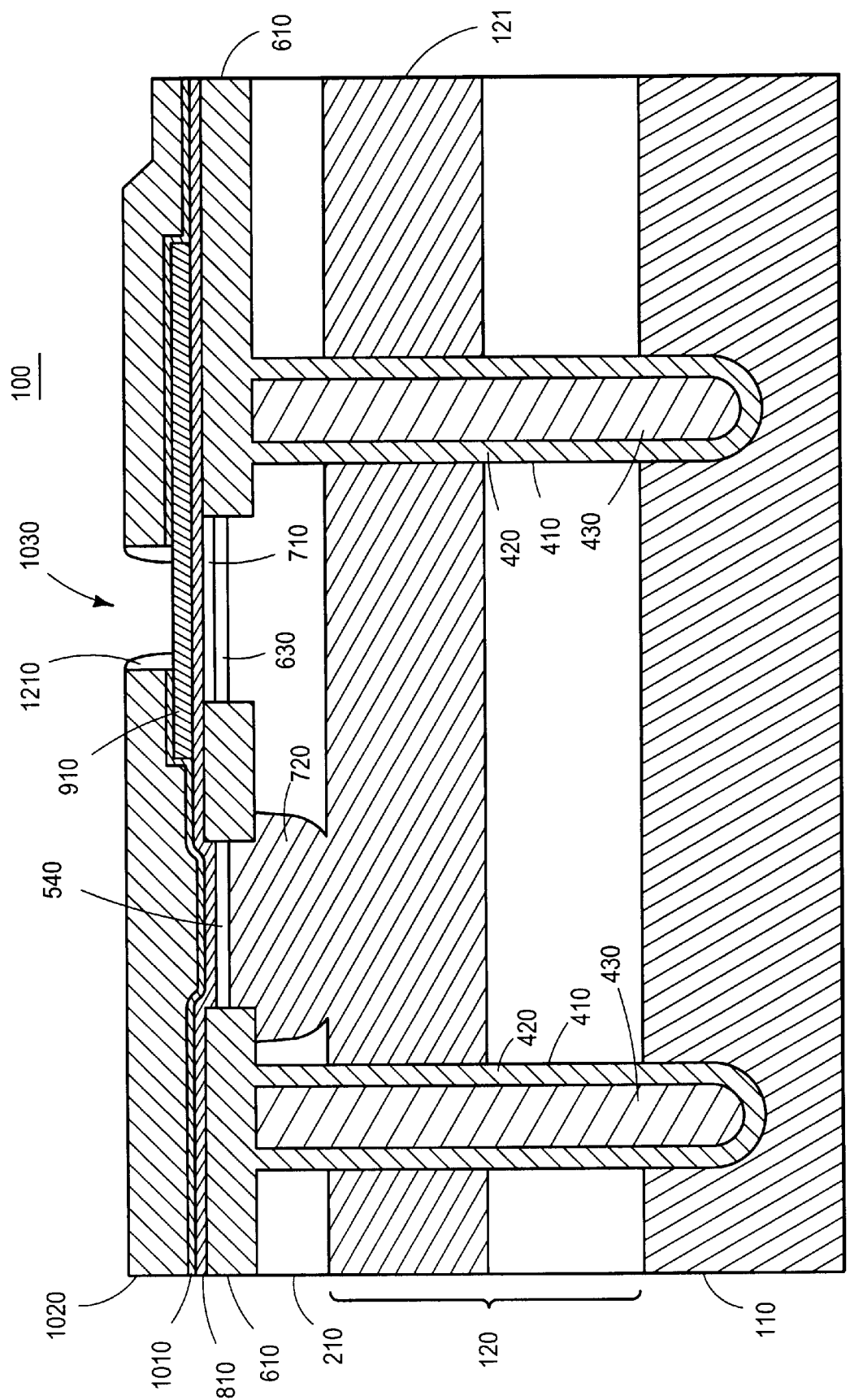

FIG. 11 illustrates the formation of an electrically insulative layer 1110 over layer 1020 and in hole 1030. In the preferred embodiment, layer 1110 is comprised of silicon nitride and has a thickness of approximately 100 nanometers. In FIG. 12, layer 1110 (FIG. 11) is anisotropically etched to leave spacers or portions 1210 in hole 1030. Portions 1210 are located along the side walls of hole 1030 and are also located over portion 910 of the electrically insulative layer. In the preferred embodiment, the spacers or portions 1210 physically contact the side walls of hole 1030 and also physically contact portion 910.

Figure 13:
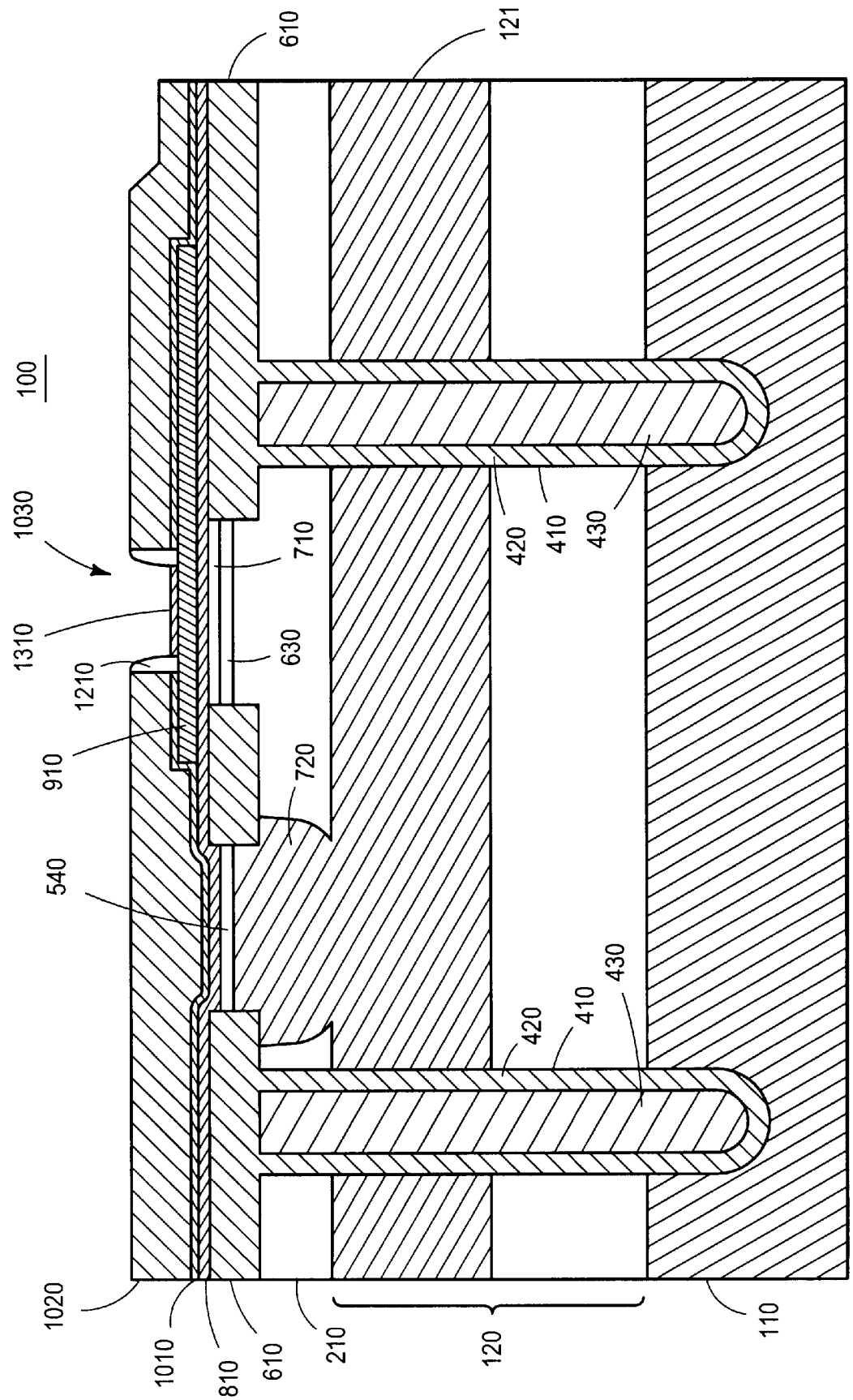
Figure 14:
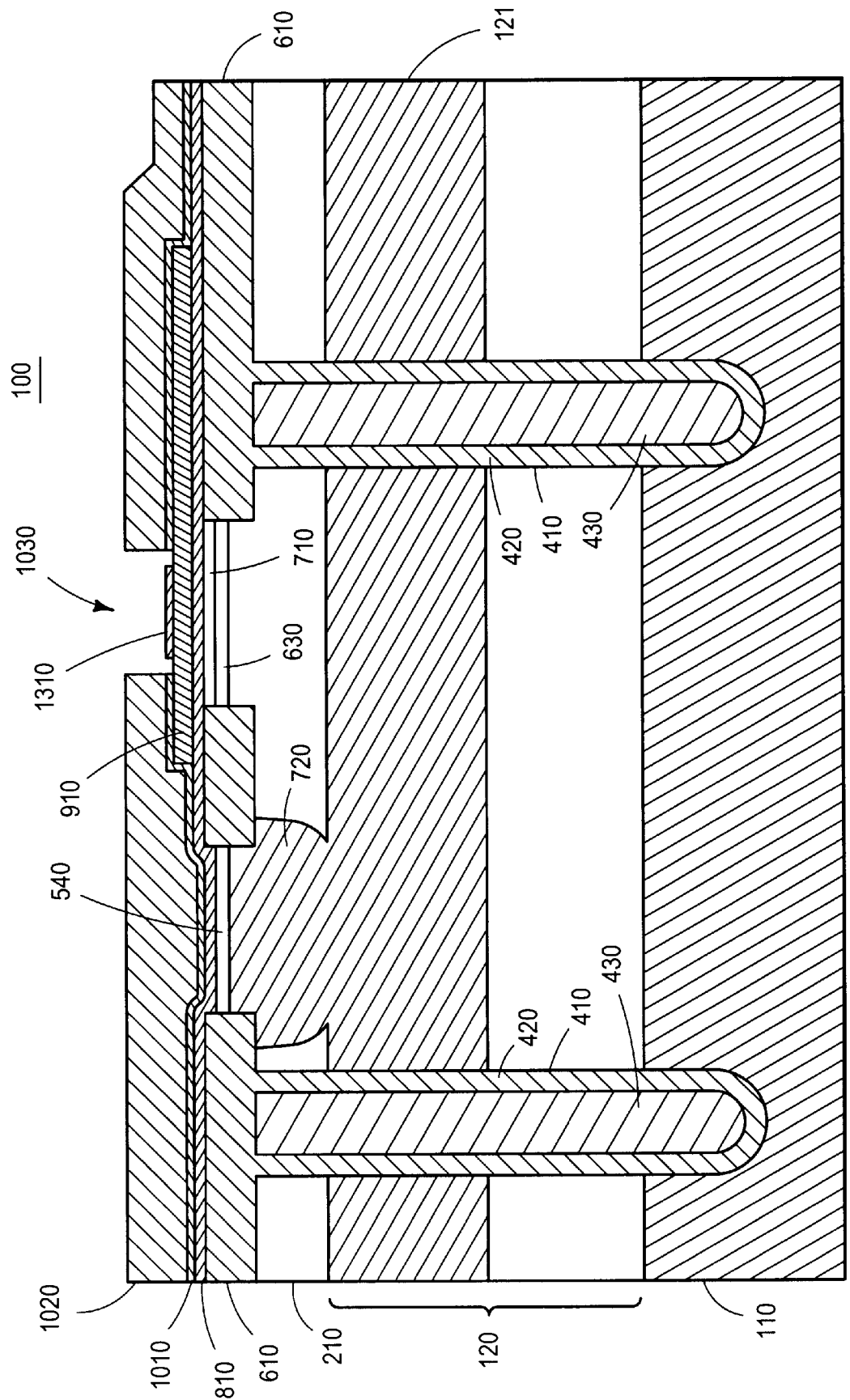

Turning to FIG. 13, an electrically insulative layer 1310 is formed over portion 910 of the electrically conductive layer and adjacent to the spacers or portions 1210. In the preferred embodiment, layer 1310 is comprised of silicon dioxide and is selectively grown on portion 910 using a thermal oxidation process. As illustrated in FIG. 14, the spacers or portions 1210 (FIG. 13) are removed after the formation of layer 1310. The removal of the spacers exposes portions of portion 910 of the electrically conductive layer.

Figure 15:
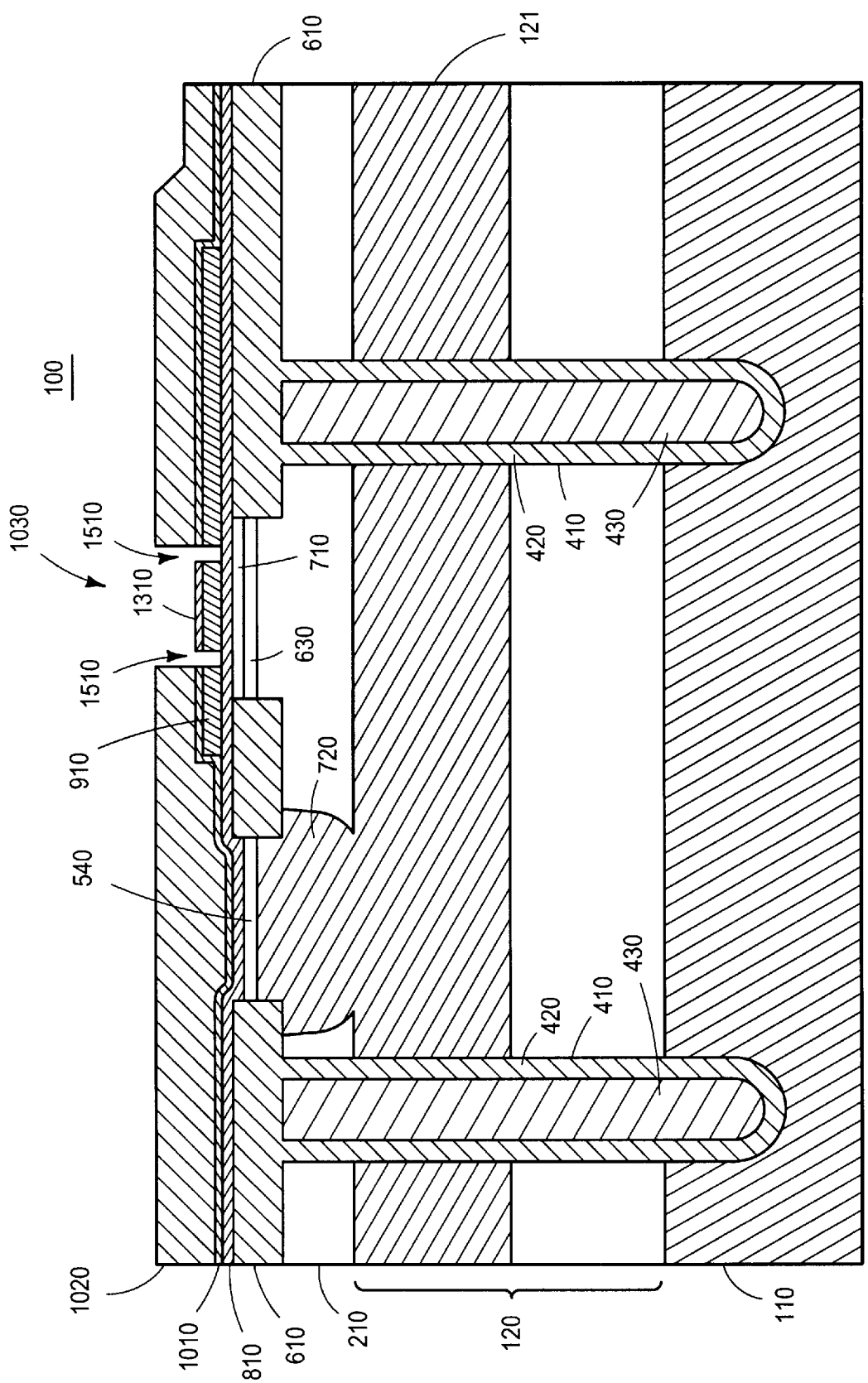
Figure 16:
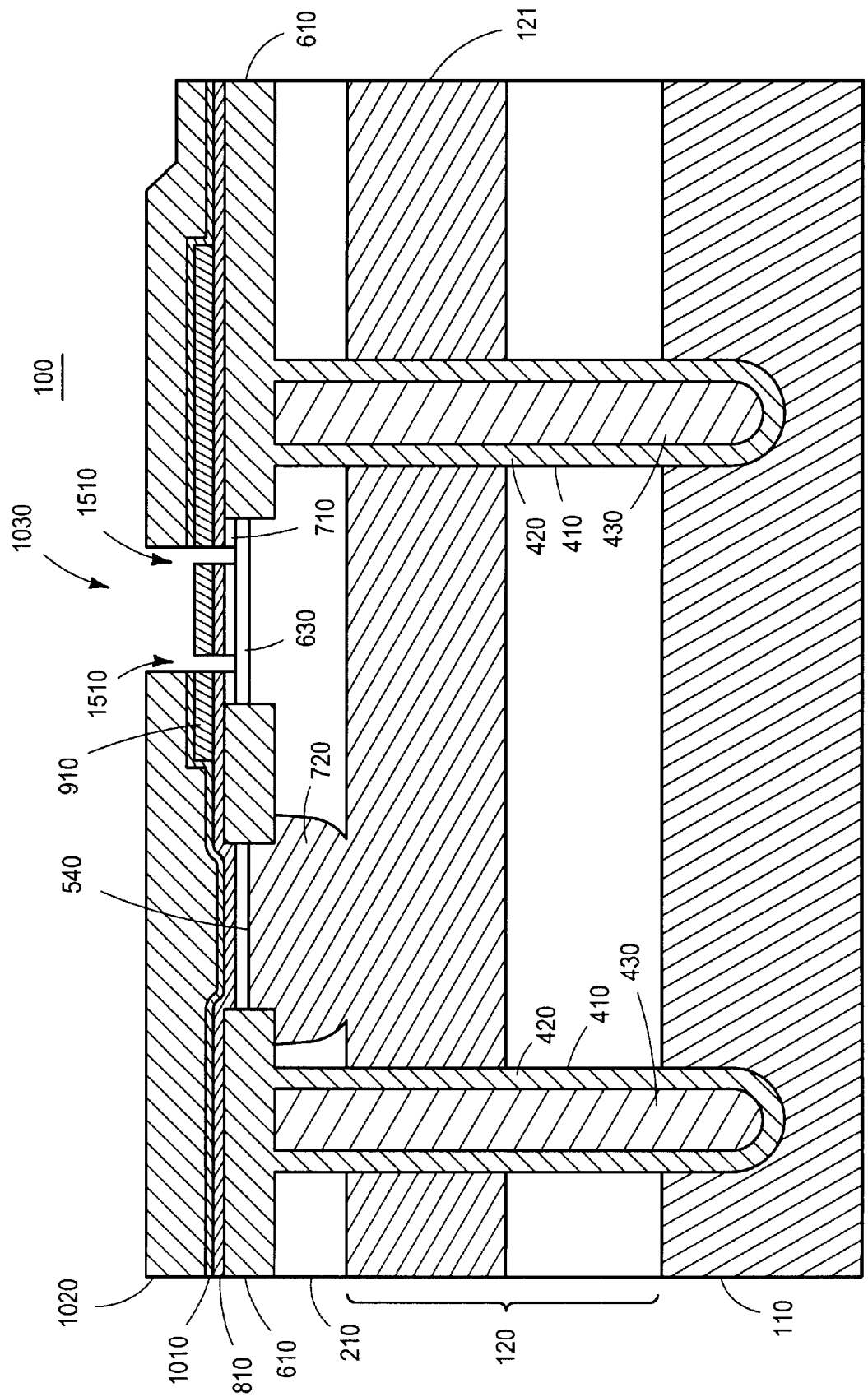

As illustrated in FIG. 15, layers 1310 and 1020 are used as self-aligned etch masks to pattern holes 1510 into portion 910 of the electrically conductive layer. Holes 1510 are preferably only etched into a portion of portion 910. In FIG. 16, holes 1510 are etched or extended into portions of layers 810 and 710. During the etching of layer 710, layer 1310 (FIG. 15) and a top portion of layer 1020 are also removed. As illustrated in FIG. 16, holes 1510 are formed within hole 1030 and expose portions of layer 630.

Figure 17:
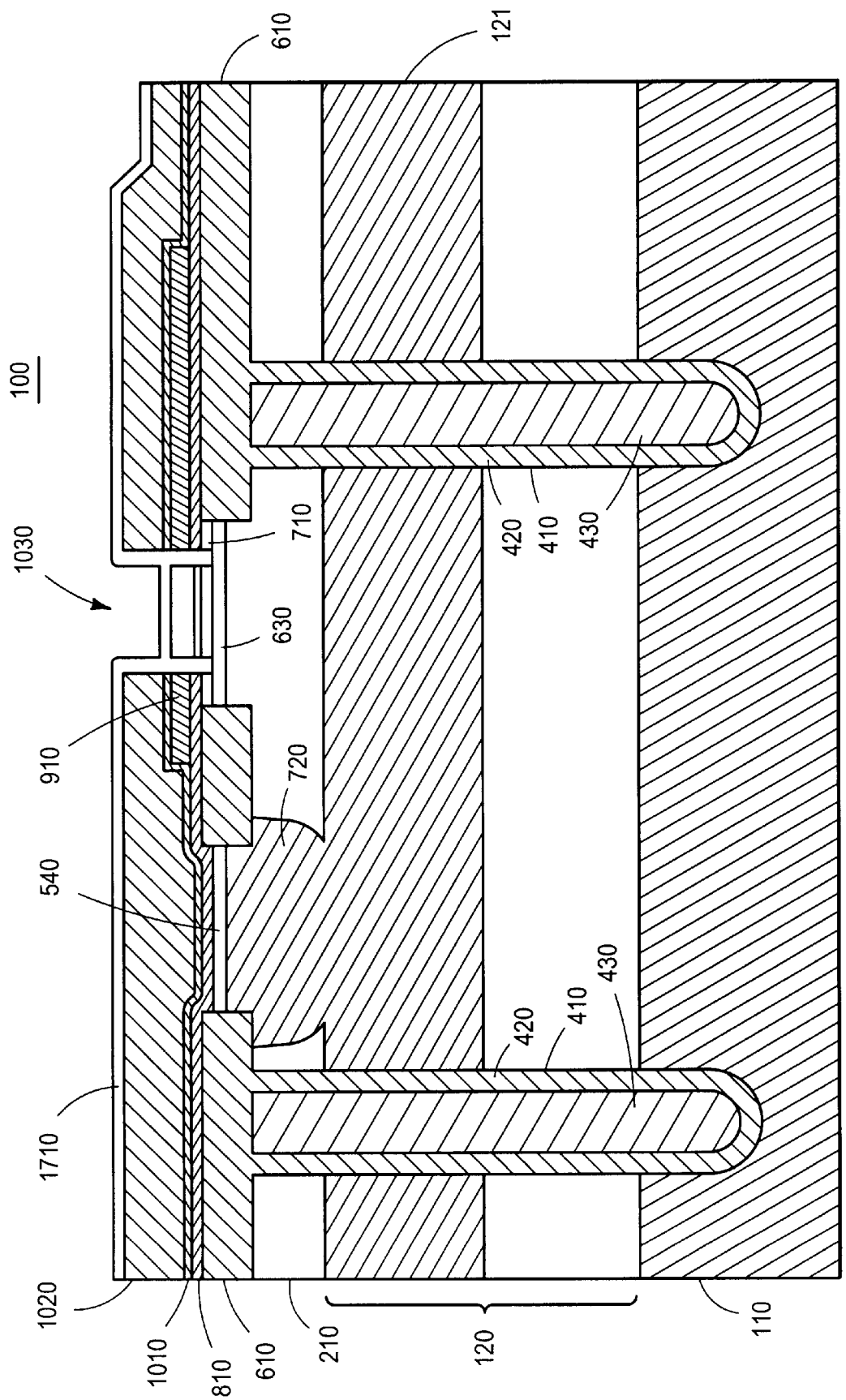

FIG. 17 illustrates a layer 1710 deposited over layer 1020 and in holes 1030 and 1510 (FIG. 16). In the preferred embodiment, layer 1710 is located on or contacts layer 1020 and epitaxial layer 630. Also in the preferred embodiment, layer 1710 is an electrically conductive layer comprised of doped polysilicon. As an example, layer 1710 can have a thickness of approximately 150 nanometers.

Figure 18:
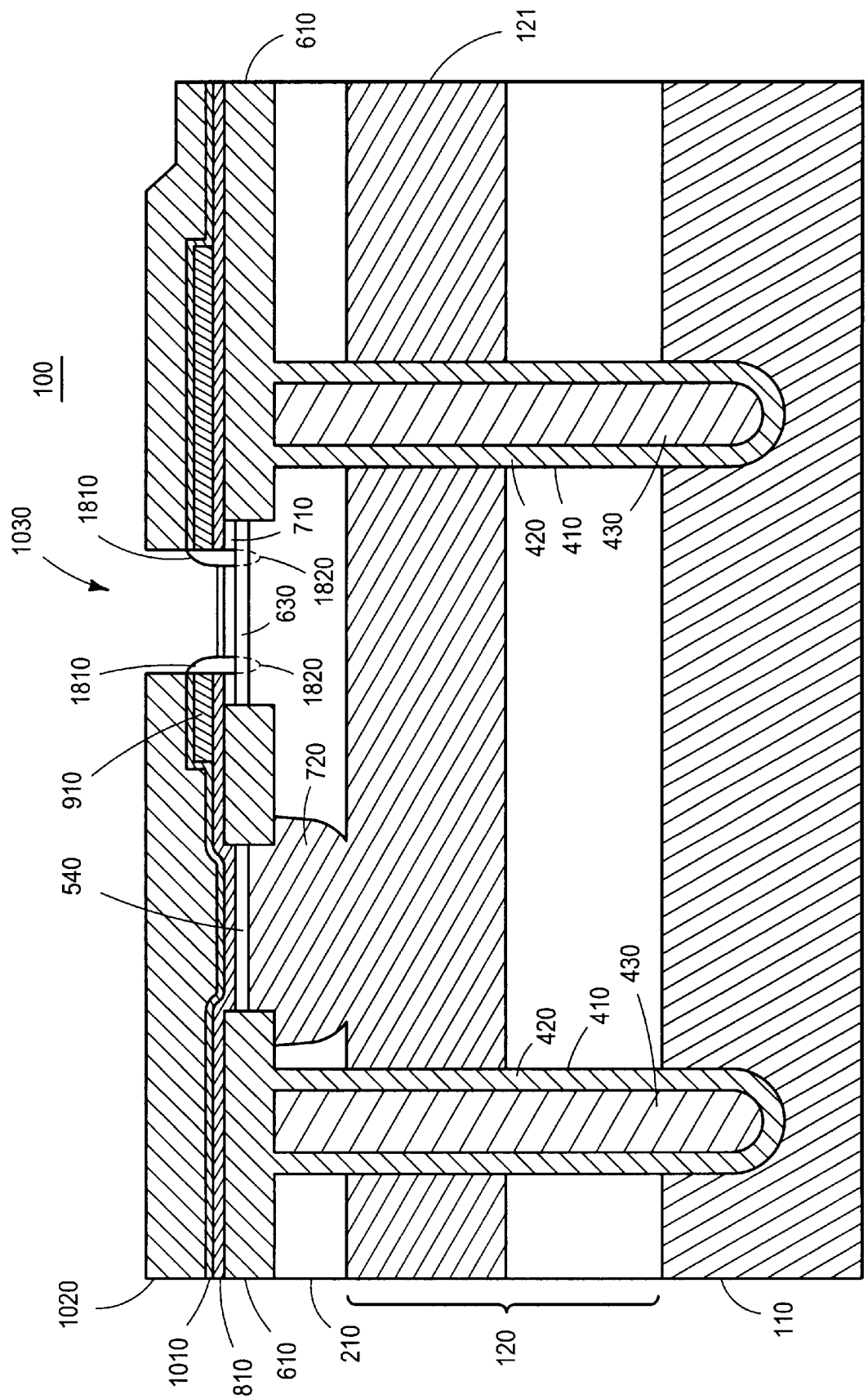

Next, in FIG. 18, layer 1710 (FIG. 17) is anisotropically etched to leave spacers or portions 1810 within hole 1030. In the preferred embodiment, portions 1810 physically contact and are electrically coupled to portion 910 of the electrically conductive layer. Also in the preferred embodiment, portions 1810 contact portions of layer 630. The formation of portions 1810 also removes a portion of portion 910 located between portions 1810. Doped regions 1820 are diffused from portions 1810 into layer 630. Doped regions 1820 can also extend into epitaxial layer 210. The dopant forming regions 1820 can originate from portion 910 of the electrically conductive layer and from portions 1810.

Figure 19:
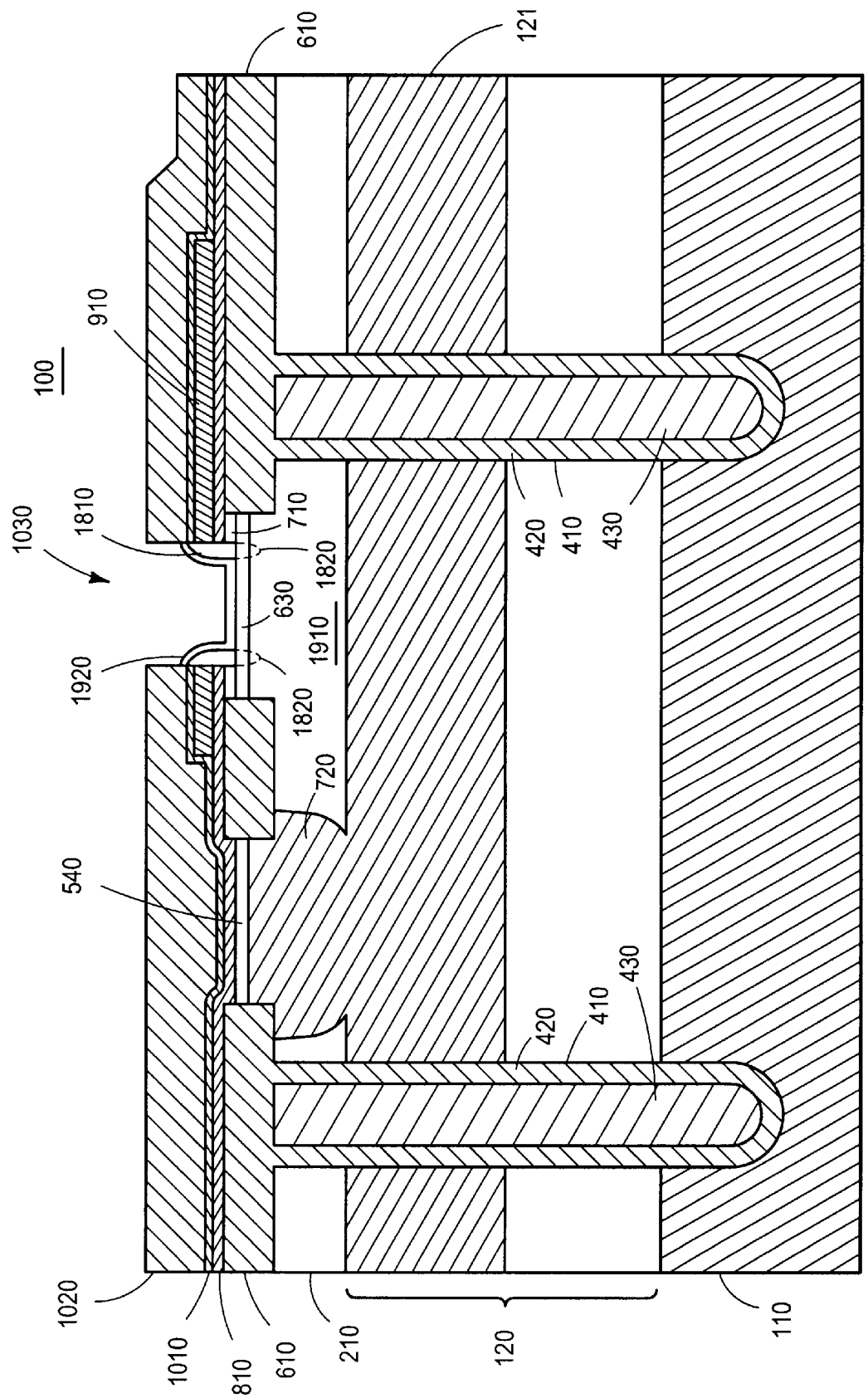

As illustrated in FIG. 19, a portion of layers 810 and 710 located between portions 1810 are also etched or removed to expose a portion of epitaxial layer 630. Then, a layer 1920 is formed over layer 630 and portions 1810. In the preferred embodiment, layer 1920 is an electrically insulative layer. As an example, layer 1920 can be comprised of silicon dioxide, can have a thickness of approximately 15 nanometers, and can be selectively grown on layer 630 and portions 1810 using a thermal oxidation process. Layer 1920 is located within hole 1030.

Figure 20:
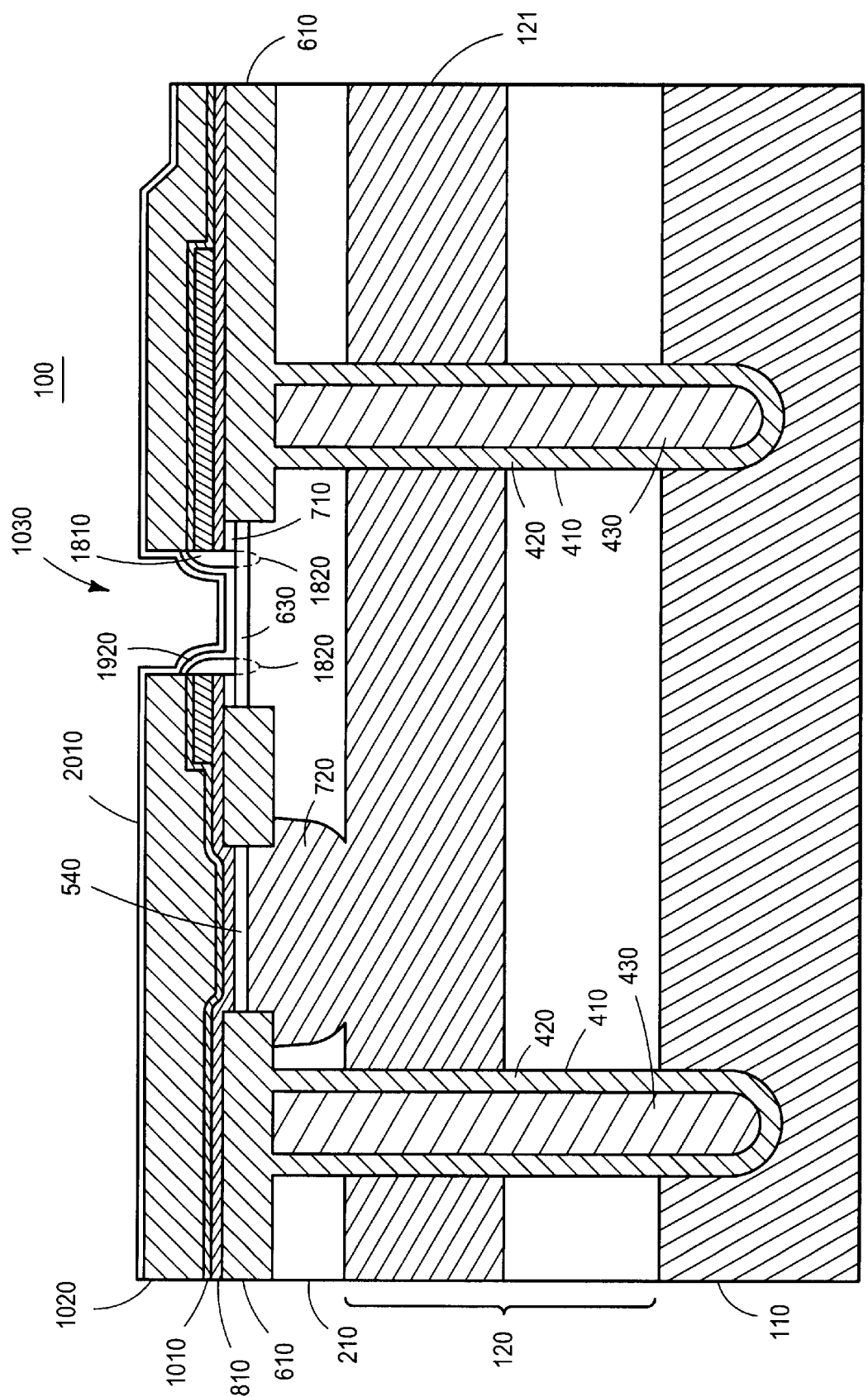
Figure 21:
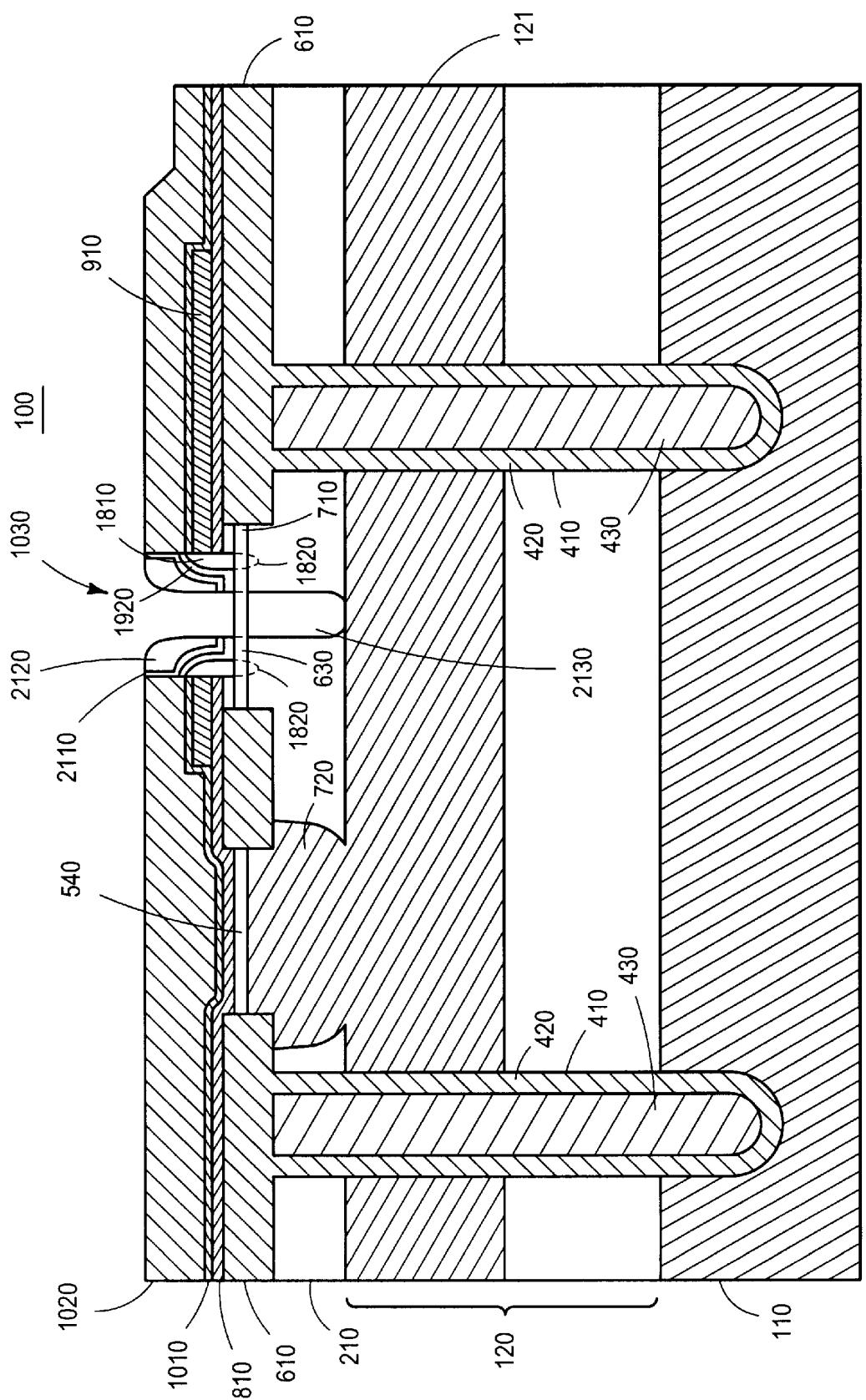

Turning to FIG. 20, a layer 2010 is formed over layer 1020 and in hole 1030 over layer 1920. In the preferred embodiment, layer 2010 is an electrically insulative layer. As an example, layer 2010 can be comprised of silicon nitride and can have a thickness of approximately 100 nanometers. Next, in FIG. 21, a polysilicon layer is formed over layer 2010 (FIG. 20) and in hole 1030. The polysilicon layer and layer 2010 (FIG. 20) are anisotropically etched to form spacers or portions 2120 and 2110, respectively, in hole 1030. Spacers or portions 2110 and 2120 are located adjacent to the side walls of hole 1030. The formation of portions 2110 and 2120 expose a portion of layer 1920.

An optional doped region 2130 can be formed in epitaxial layer 210 after the formation of portions 2110 and 2120. Region 2130 can be formed by using a single implant or multiple implants with different implant energies and ion doses. The use of region 2130 permits the use of a lower doping concentration in epitaxial layer 210 to reduce the base-to-collector capacitance in the HBT of component 100 while simultaneously permitting a higher transit frequency in the HBT of component 100. A trade-off exists, however, between the transit frequency and the collector-to-base breakdown voltage. A higher doping concentration in region 2130 permits a higher transit frequency for a faster HBT in high speed applications, but also reduces the collector-to-base breakdown voltage of the HBT. A lower doping concentration in region 2130 lowers the transit frequency and slows down the HBT, but increases the collector-to-base breakdown voltage of the HBT for use in high voltage applications.

Figure 22:
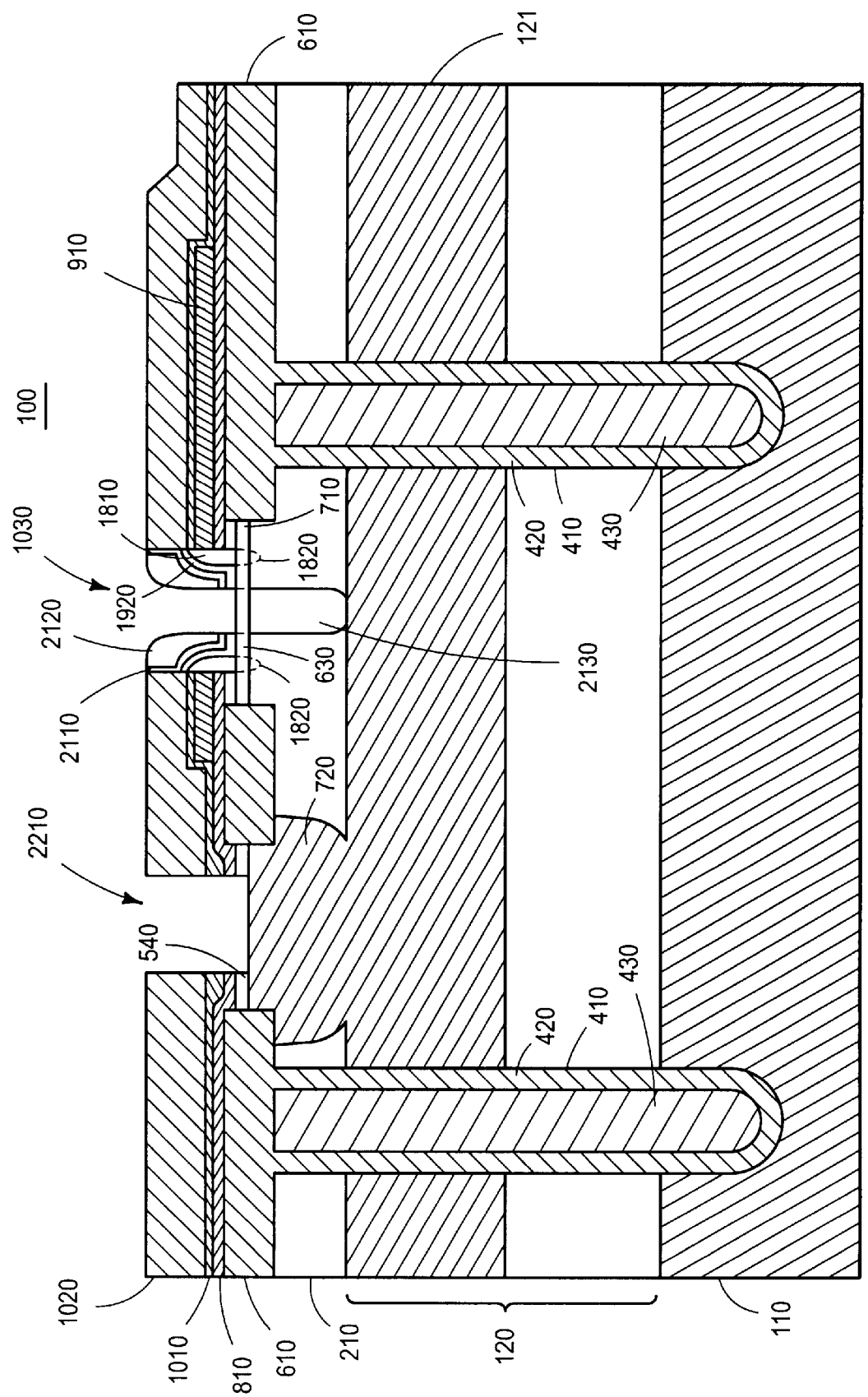

As illustrated in FIG. 22, a hole 2210 is formed in layers 1020, 1010, 810, and 540. Hole 2210 forms a collector opening. The formation of hole 2210 within layer 710 also removes the exposed portion of layer 1920 in hole 1030. Accordingly, after the formation of hole 2210, a portion of layer 630 is exposed within hole 1030.

Figure 23:
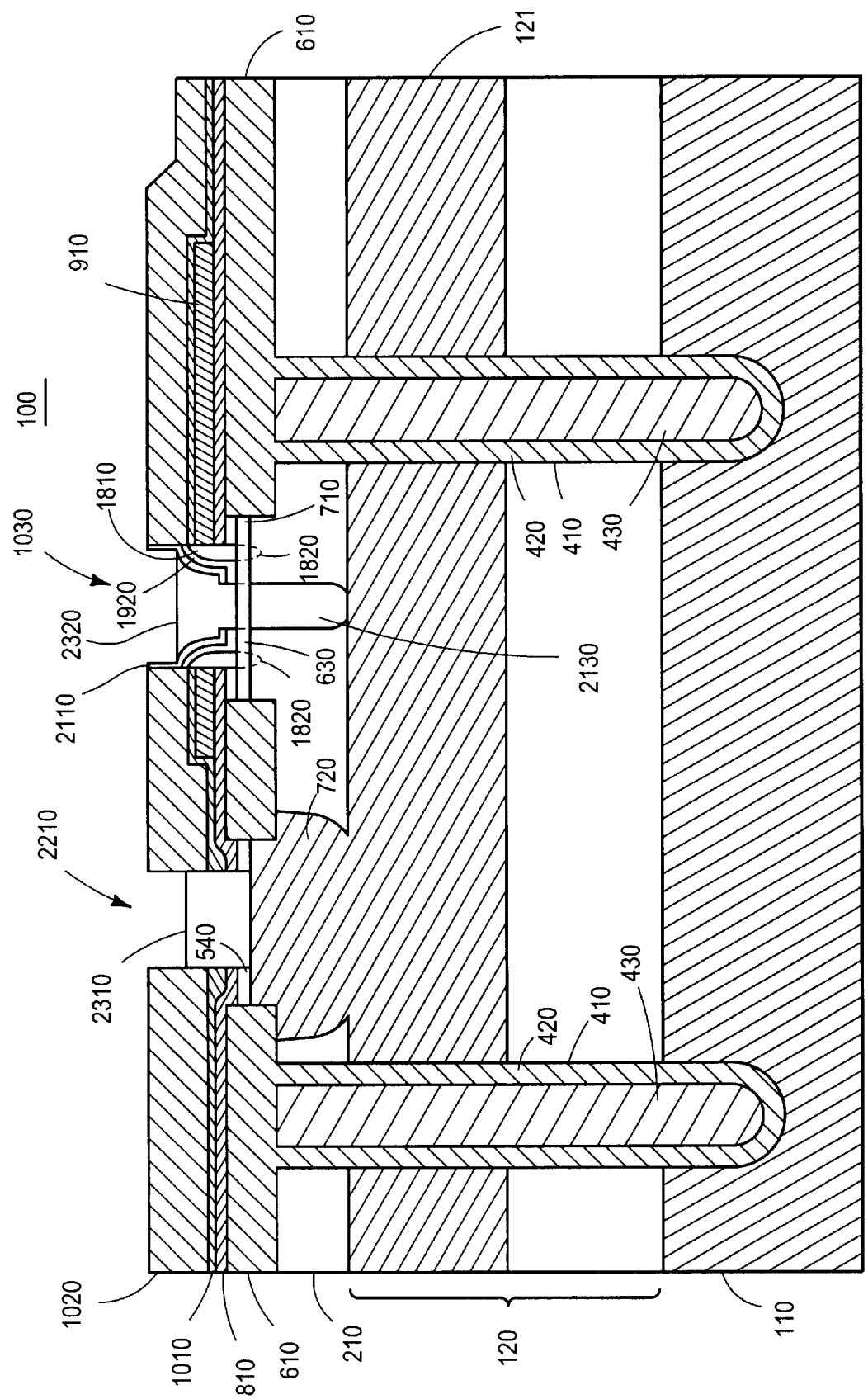

Next, in FIG. 23, a doped polysilicon layer is deposited over layer 1020 and in holes 2210 and 1030 to a thickness of approximately 800 nanometers. The doped polysilicon layer is etched back or planarized to leave portion 2310 within hole 2210 and to leave portion 2320 within hole 1030. A portion of spacer or portion 2120 (FIG. 22) is part of portion 2320. Portion 2310 forms a portion of the collector region for the HBT, and portion 2320 forms an emitter region for the HBT. In the preferred embodiment, portions 2310 and 2320 are formed simultaneously with each other. Portions 2310 and 2320 are implanted with a high concentration of an N-type dopant, and then, portions 2310 and 2320 are annealed. In the preferred embodiment, the doping concentration of portion 2310 is the same as that for region 720 and layer 121. Also in the preferred embodiment, portion 2310 physically contacts and is coupled to region 720. A heterojunction exists at the interface between layer 630 and portion 2320.

Figure 24:
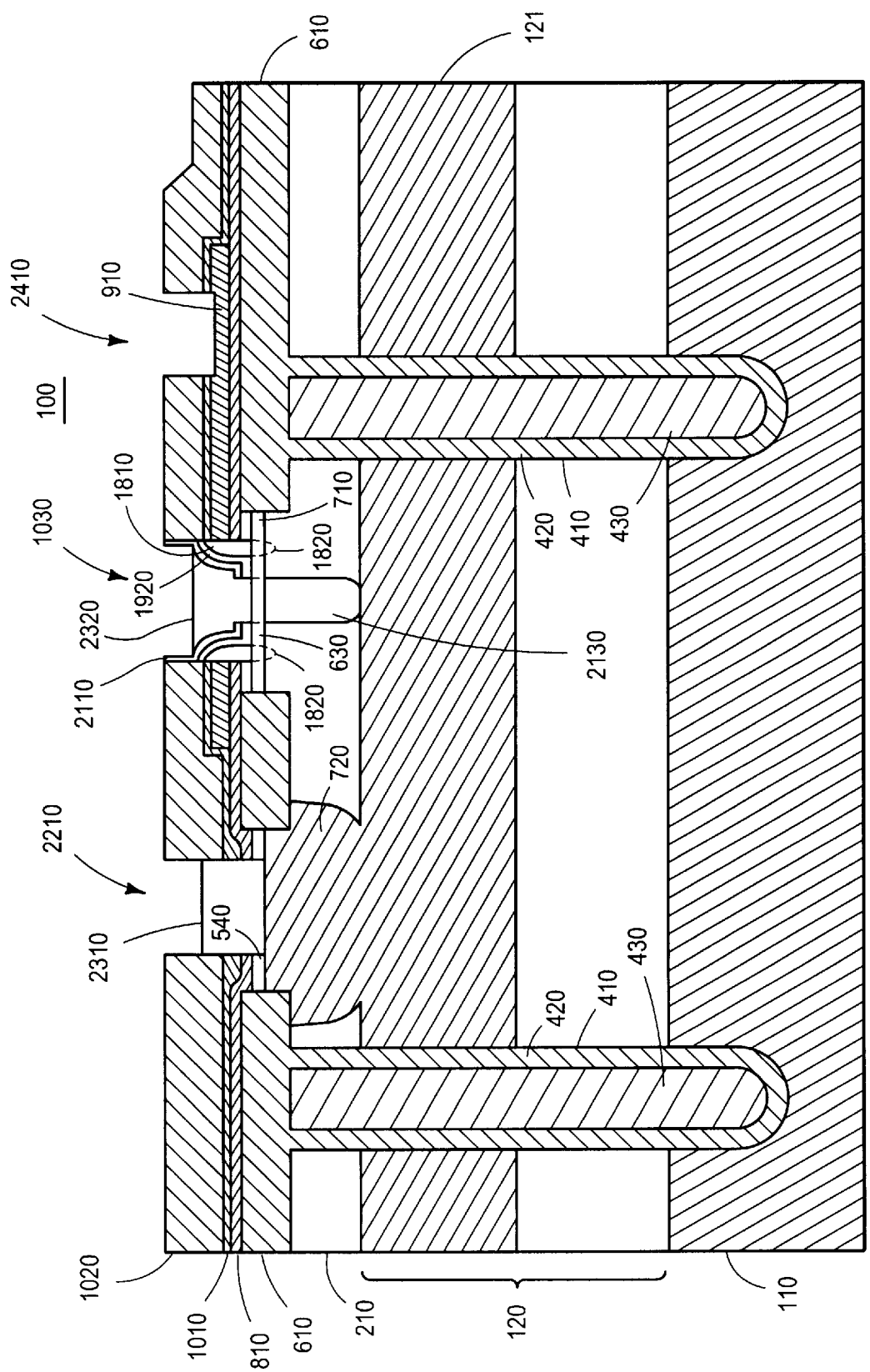
Figure 25:
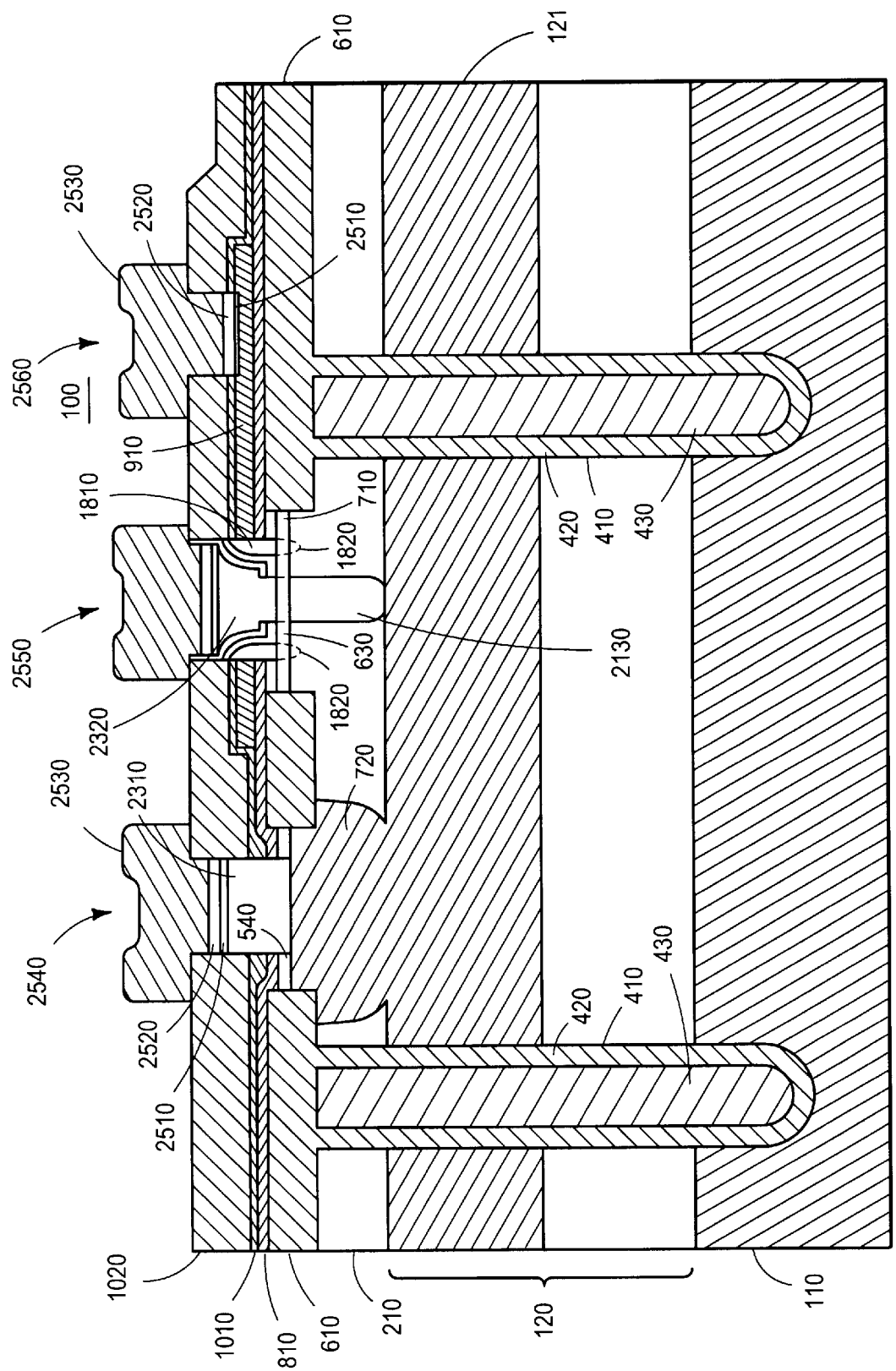

In FIG. 24, a hole 2410 is formed within layers 1020 and 1010 to expose a portion of portion 910 of the electrically conductive layer. Hole 2410 is used to provide an electrical contact to the base region of the HBT. Turning to FIG. 25, a base contact 2560 is formed within hole 2410 (FIG. 24) over portion 910 of the electrically conductive layer. Base contact 2560 is electrically coupled to the base region of the HBT via portion 910 of the electrically conductive layer and portions 1810. Also illustrated in FIG. 25, an emitter contact 2550 is formed over portion 2320 and is electrically coupled to the emitter region of the HBT. Emitter contact 2550 is preferably located directly over layer 630, which forms the base region of the HBT. Furthermore, a collector contact 2540 is formed over portion 2310 of the collector region for the HBT. Collector contact 2540 is electrically coupled to the collector region of the HBT. In the preferred embodiment, contacts 2540, 2550, and 2560 are formed simultaneously with each other. In the preferred embodiment, contacts 2540, 2550, and 2560 are each comprised of a platinum silicide layer 2510, a titanium tungsten layer 2520, and an aluminum copper layer 2530. As an example, layers 2510, 2520, and 2530 can have thicknesses of approximately 18, 150, and 650 nanometers, respectively.

Figure 26A:
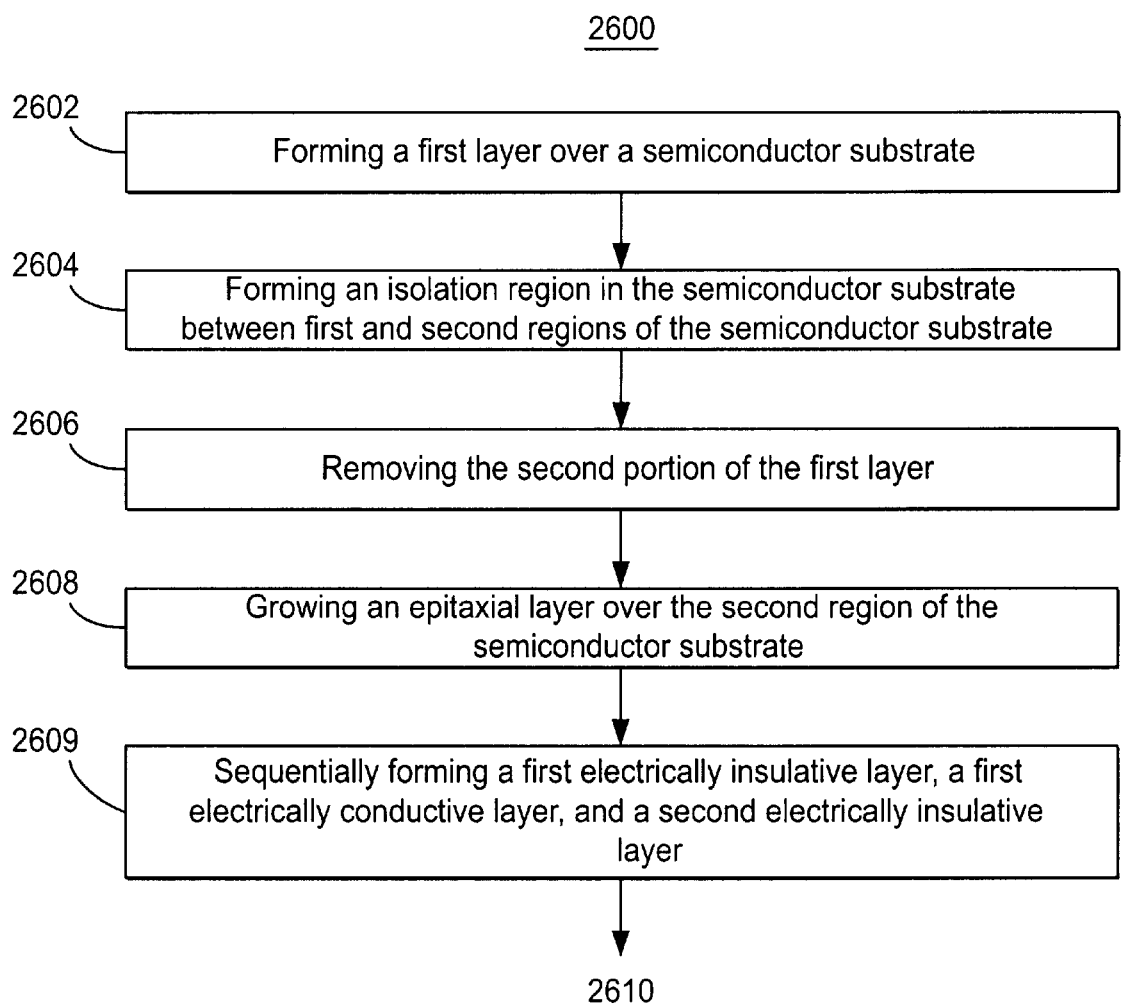
FIGS. 26A and 26B illustrate a flow chart of the method of manufacturing the semiconductor component of FIGS. 1 through 25 in accordance with an embodiment of the invention.
Figure 26B:
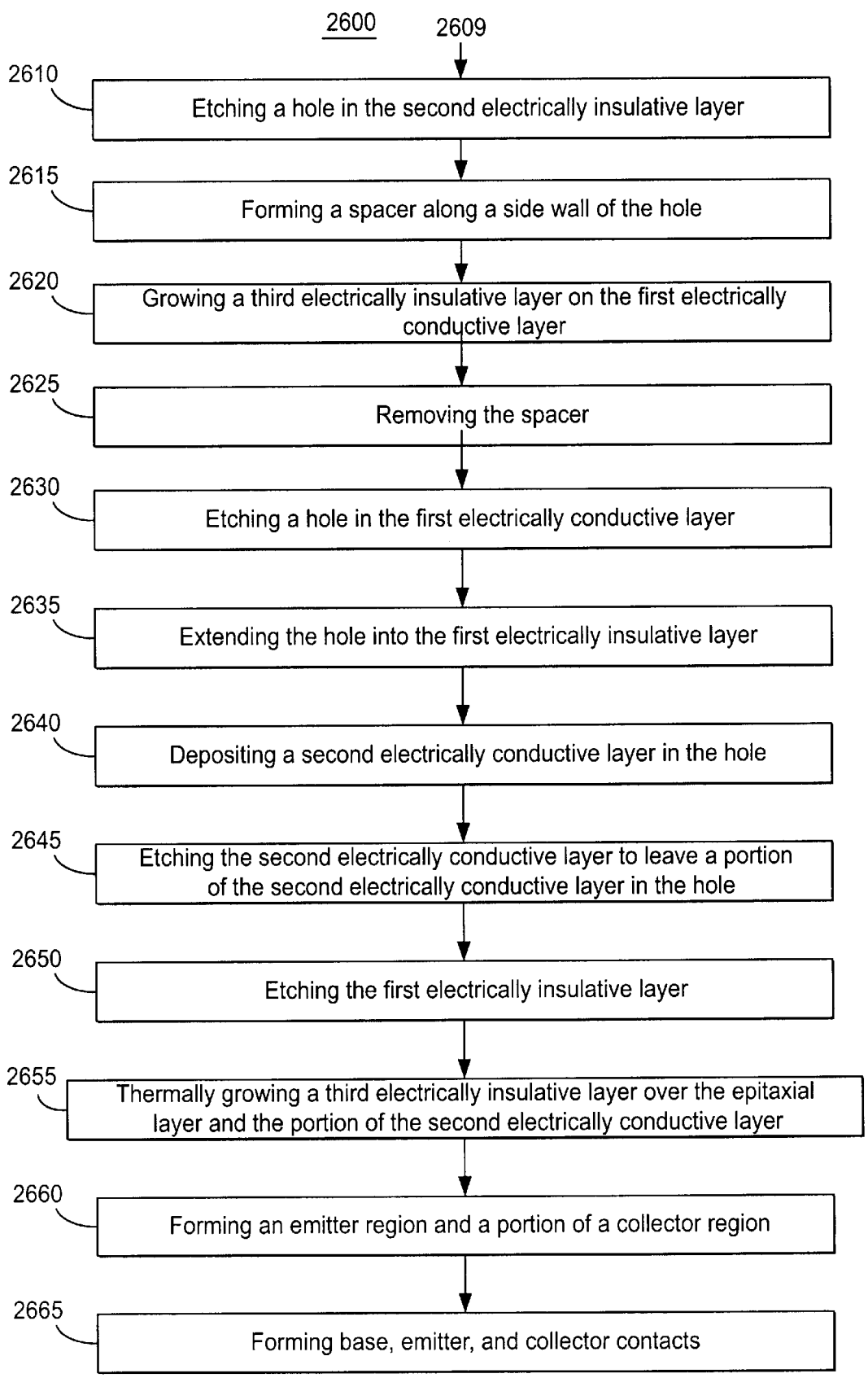

FIGS. 26A and 26B illustrate a flow chart 2600 of the method of manufacturing semiconductor component 100 described previously with respect to FIGS. 1 through 25. At a step 2602 of flow chart 2600 in FIG. 26A, a first layer is formed over a semiconductor substrate. As an example, the first layer of step 2602 can be similar to layer 220 in FIG. 2. A first portion of the first layer is located over a first region of the semiconductor substrate, and a second portion of the first layer is located over a second region of the semiconductor substrate. At a step 2604 of flow chart 2600, an isolation region is formed in the semiconductor substrate between the first and second regions of the semiconductor substrate. As an example, the isolation region of step 2604 can be similar to one of isolation regions 610 in FIG. 6A.

Then, at a step 2606 in flow chart 2600, the second portion of the first layer is removed. As an example, FIG. 6D can represent the semiconductor component after step 2606 in FIG. 26A. Next, at a step 2608, an epitaxial layer is grown over the second region of the semiconductor substrate. As an example, the epitaxial layer of step 2608 can be similar to layer 630 in FIG. 6E. Subsequently, at a step 2609 in flow chart 2600, a first electrically insulative layer, a first electrically conductive layer, and a second electrically insulative layer are sequentially formed over the epitaxial layer of step 2608 and the semiconductor substrate.

Turning to FIG. 26B, at a sep 2610 in flow chart 2600, a hole is etched in the second electrically insulative layer. At a step 2615, a spacer is formed along the side wall of the hole. The spacer is also preferably located over a portion of the first electrically conductive layer and over a portion of the first electrically insulative layer. Next, at a step 2620, a third electrically insulative layer is grown on the first electrically conductive layer. The third electrically insulative layer is also preferably located adjacent to the spacer. Then, at a step 2625, the spacer is removed after forming the third electrically insulative layer.

At a step 2630, a hole is etched in the first electrically conductive layer. In particular, the hole is preferably etched into the portion of the first electrically conductive layer over which the spacer was located. The third electrically insulative layer is preferably used as an etch mask while etching the first electrically conductive layer during step 2630. Next, at a step 2635, the hole of step 2630 is extending into the first electrically insulative layer. In particular, the hole is preferably extended into the portion of the first electrically insulative layer over which the spacer was located. The third electrically insulative layer is preferably removed while etching the first electrically insulative layer.

Then, at a step 2640, a second electrically conductive layer is deposited in the hole. The second electrically conductive layer is also preferably located over the first electrically conductive layer, over the second electrically insulative layer, and on the substrate. Subsequently, at a step 2645, the first and second electrically conductive layers are etched to leave a portion of the second electrically conductive layer in the hole. The portion of the second electrically conductive layer also preferably contacts the first electrically conductive layer and the substrate.

Next, at a step 2650, the first electrically insulative layer is etched to expose a portion of the substrate, and at a step 2655, a third electrically insulative layer is thermally grown over the epitaxial layer and the portion of the second electrically conductive layer. Then, at a step 2660, an emitter region and a portion of a collector region are formed, and at a step 2665, base, emitter, and collector contacts are formed.

Therefore, an improved method of manufacturing a semiconductor component and semiconductor component thereof is provided to overcome the disadvantages of the prior art. The method of manufacturing the semiconductor component is compatible with existing semiconductor processing techniques, and the resulting semiconductor component has superior high frequency performance characteristics.

Although the invention has been described with reference to specific embodiments, it will be understood by those skilled in the art that various changes may be made without departing from the spirit or scope of the invention. For instance, the numerous details set forth herein such as, for example, the material compositions, the doping concentrations, and the layer thicknesses are provided to facilitate the understanding of the invention and are not provided to limit the scope of the invention. For example, the material compositions of many of the electrically insulative layers and electrically conductive layers can be interchanged with other electrically insulative materials and electrically conductive materials, respectively, known in the art. As another example, FIG. 25 illustrates an HBT with a single set of base and emitter fingers, but one skilled in the art will understand that an HBT in accordance with the principles of the invention can have a plurality of base and emitter fingers. As an additional example, the HBT in FIG. 25 is described to be an NPN bipolar transistor, but one skilled in the art will understand that an HBT in accordance with the principles of the invention can be a PNP bipolar transistor. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A method of manufacturing a semiconductor component comprising:

forming a first layer over a semiconductor substrate, a first portion of the first layer located over a first region of the semiconductor substrate and a second portion of the first layer located over a second region of the semiconductor substrate;

after forming the first layer, forming an isolation region in the semiconductor substrate between the first and second regions of the semiconductor substrate;

after forming the isolation region, removing the second portion of the first layer;

after removing the second potion of the first layer, growing an epitaxial layer over the second region of the semiconductor substrate;

forming a conductive spacer over the epitaxial layer to contact a base electrode of the semiconductor component; and forming a dielectric spacer adjacent to the conductive spacer to isolate the base electrode from an emitter of the semiconductor component.

2. The method of claim 1 wherein:
the semiconductor substrate has a top surface over which the first layer is formed;
the isolation region has a top surface located above the top surface of the semiconductor substrate; and
the epitaxial layer has a top surface located approximately co-planar with the top surface of the isolation region.

3. The method of claim 2 wherein:
the first layer has a top surface located below the top surface of the isolation region.

4. The method of claim 3 wherein:
forming the first layer further comprises:
forming the first layer on the semiconductor substrate.

5. The method of claim 1 wherein:
growing the epitaxial layer further comprises:
selectively growing the epitaxial layer only over the second region of the semiconductor substrate.

6. The method of claim 1 wherein:
removing the second portion of the first layer exposes the second region of the substrate.

7. The method of claim 1 wherein:
growing the epitaxial layer further comprises:
growing the epitaxial layer to a thickness of approximately fifty to two hundred nanometers.

8. The method of claim 1 wherein:
growing the epitaxial layer further comprises:
growing the epitaxial layer to be comprised of a material selected from the group consisting of silicon, silicon germanium, and silicon germanium carbon.

9. The method of claim 1 wherein:
at least a portion of the epitaxial layer forms a base region for a heterojunction bipolar transistor.

10. The method of claim 3 further comprising:
forming a second layer over the first layer, the second layer having a top surface, a first portion of the second layer located over the first portion of the first layer and a second portion of the second layer located over the second portion of the first layer,
wherein:
forming the isolation region further comprises:
forming the top surface of the isolation region to be approximately co-planar with the top surface of the second layer.

11. The method of claim 10 further comprising:
removing the second layer after forming the isolation region.

12. The method of claim 6 wherein:
removing the second portion of the first layer further comprises:
keeping the first portion of the first layer over the first region of the semiconductor substrate.

13. The method of claim 12 wherein:
growing the epitaxial layer further comprises:
growing the epitaxial layer to a thickness of approximately fifty to two hundred nanometers while the first portion of the first layer remains over the first region of the semiconductor substrate.

14. The method of claim 12 wherein:
growing the epitaxial layer further comprises:
growing the epitaxial layer to be comprised of a material selected from the group consisting of silicon, silicon germanium, and silicon germanium carbon while the first portion of the first layer remains over the first region of the semiconductor substrate.

15. The method of claim 12 wherein:
growing the epitaxial layer further comprises:
growing the epitaxial layer while the first portion of the first layer remains over the first region of the semiconductor substrate; and
at least a portion of the epitaxial layer forms a base region for a heterojunction bipolar transistor.

16. A method of manufacturing a semiconductor component comprising:
patterning each of first and second electrically insulative layers, located over a semiconductor substrate, into at least first and second portions;
after patterning, forming an isolation region in the semiconductor substrate and between the first and second portions of the first and second electrically insulative layers;
removing the first and second portions of the second electrically insulative layer;
removing the second portion of the first electrically insulative layer to expose a region of the semiconductor substrate;
growing an epitaxial layer over the region of the semiconductor substrate;
forming a conductive spacer to contact a base electrode of the semiconductor component; and
forming a dielectric spacer adjacent to the conductive spacer to isolate the base from an emitter of the semiconductor component.

17. The method of claim 16 wherein:
at least a portion of the epitaxial layer forms a base region for a heterojunction bipolar transistor.

18. The method of claim 17 wherein:
the semiconductor substrate has a top surface;
the first electrically insulative layer has a top surface and is located over the top surface of the semiconductor substrate;
the second electrically insulative layer has a top surface and is located over the top surface of the first electrically insulative layer;
forming the isolation region further comprises:
forming a top surface of the isolation region to be approximately co-planar with the top surface of the second electrically insulative layer; and
growing the epitaxial layer further comprises:
forming a top surface of the epitaxial layer to be approximately co-planar with the top surface of the isolation region.

19. The method of claim 17 wherein:
removing the second portion of the first electrically insulative layer further comprises:
keeping the first portion of the first electrically insulative layer over the semiconductor substrate; and
growing the epitaxial layer further comprises:
growing the epitaxial layer to a thickness of approximately fifty to two hundred nanometers and to be comprised of a material selected from the group consisting of silicon, silicon germanium, and silicon germanium carbon while the first portion of the first electrically insulative layer remains over the semiconductor substrate.

20. A semiconductor component comprising:

a semiconductor substrate, wherein at least a portion of the semiconductor substrate forms at least a portion of a collector region for a transistor;

an epitaxial layer located over a region of the semiconductor substrate, wherein at least a portion of the epitaxial layer forms at least a portion of a base region for the transistor;

an electrically conductive spacer located over and electrically coupled to the epitaxial layer; and an electrically conductive layer located over and electrically coupled to the epitaxial layer, the conductive spacer electrically coupling together the epitaxial layer electrically and the electrically conductive layer, wherein at least a portion of the electrically conductive layer forms at least a portion of an emitter region for the transistor.

21. The semiconductor component of claim 20 wherein:
the epitaxial layer has a thickness of approximately fifty to two hundred nanometers.

22. The semiconductor component of claim 20 wherein:
the epitaxial layer is comprised of a material selected from the group consisting of silicon, silicon germanium, and silicon germanium carbon.

23. The semiconductor component of claim 20 wherein:
the electrically conductive spacer has at least two portions; and
the electrically conductive layer is located between the two portions of the electrically conductive spacer.

24. The semiconductor component of claim 23 further comprising:
an electrically insulative layer located between the electrically conductive spacer and the electrically conductive layer.

* * * * *